(12) United States Patent
Fujiwara et al.

(10) Patent No.: US 11,658,174 B2
(45) Date of Patent: May 23, 2023

(54) SEMICONDUCTOR DEVICE WITH MULTIPLE METAL-INSULATOR-METAL CAPACITORS AND METHOD FOR MANUFACTURING THE SAME

(71) Applicant: DENSO CORPORATION, Kariya (JP)

(72) Inventors: Tsuyoshi Fujiwara, Kariya (JP); Seiji Noma, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/028,163

(22) Filed: Sep. 22, 2020

(65) Prior Publication Data
US 2021/0005597 A1    Jan. 7, 2021

Related U.S. Application Data

(63) Continuation of application No. PCT/JP2019/014978, filed on Apr. 4, 2019.

(30) Foreign Application Priority Data

Apr. 11, 2018   (JP) ............................. JP2018-076324

(51) Int. Cl.
*H01L 27/01* (2006.01)
*H01L 21/768* (2006.01)
(Continued)

(52) U.S. Cl.
CPC ...... *H01L 27/016* (2013.01); *H01L 21/76885* (2013.01); *H01L 23/5223* (2013.01);
(Continued)

(58) Field of Classification Search
CPC ... H01L 27/01; H01L 27/016; H01L 27/0688; H01L 23/522; H01L 21/768;
(Continued)

(56) References Cited

U.S. PATENT DOCUMENTS

2003/0034546 A1* 2/2003 Lin .................. H01G 4/306
257/532
2003/0170934 A1* 9/2003 Lin .................. H01L 21/76807
257/E21.582
(Continued)

FOREIGN PATENT DOCUMENTS

JP    2007-281373 A   10/2007
JP    2015-012019 A   1/2015

*Primary Examiner* — Sheng-Bai Zhu
(74) *Attorney, Agent, or Firm* — Posz Law Group, PLC

(57) ABSTRACT

A semiconductor device includes a plurality of capacitors with MIM structure disposed in an interconnection layer on a substrate. Each capacitor includes a first electrode and a second electrode provided by any two interconnection parts of the interconnection layer, in which the first electrode is one of the two interconnection parts located adjacent to the substrate and the second electrode is the other located opposite to the substrate with respect to the first electrode. One of the first and second electrode of each capacitor is provided by the same interconnection part as a subject electrode, and a distance between the first electrode and the second electrode is different among the plurality of capacitors to have different capacitances. The subject electrodes provided by the same interconnection part are covered with an insulating film of the interconnection layer, and have ends on a same plane.

9 Claims, 29 Drawing Sheets

(51) Int. Cl.
 *H01L 23/522* (2006.01)
 *H01L 21/3213* (2006.01)
 *H01L 27/06* (2006.01)

(52) U.S. Cl.
 CPC .... *H01L 23/5228* (2013.01); *H01L 21/32135* (2013.01); *H01L 27/0688* (2013.01)

(58) Field of Classification Search
 CPC ......... H01L 21/76885; H01L 21/32135; H01L 28/20; H01L 28/60
 USPC ...................................................... 257/533
 See application file for complete search history.

(56) References Cited

U.S. PATENT DOCUMENTS

| | | | | |
|---|---|---|---|---|
| 2003/0178665 A1* | 9/2003 | Takenaka | ............... | H01L 28/60 257/E21.018 |
| 2004/0065938 A1* | 4/2004 | Won | .................. | H01L 28/91 257/516 |
| 2004/0245580 A1* | 12/2004 | Lin | ..................... | H01L 21/82 257/379 |
| 2005/0230783 A1* | 10/2005 | Lin | ..................... | H01L 23/642 257/E21.582 |
| 2006/0038217 A1* | 2/2006 | Mikawa | ............ | H01L 27/11502 257/532 |
| 2006/0091443 A1* | 5/2006 | Ueda | .................. | H01G 4/385 257/313 |
| 2006/0163638 A1* | 7/2006 | Ito | ..................... | H01L 21/76816 257/532 |
| 2008/0233731 A1* | 9/2008 | Lin | ..................... | H01L 28/40 438/597 |
| 2011/0057918 A1 | 3/2011 | Kimura et al. | | |
| 2013/0207171 A1* | 8/2013 | Uno | .................. | H01L 21/0228 438/785 |
| 2016/0155547 A1* | 6/2016 | Yuan | .................. | H01C 7/006 338/9 |
| 2016/0155859 A1* | 6/2016 | Kimura | ............... | G09G 3/3648 257/43 |
| 2018/0350897 A1 | 12/2018 | Oda et al. | | |
| 2019/0088793 A1 | 3/2019 | Kimura et al. | | |

* cited by examiner

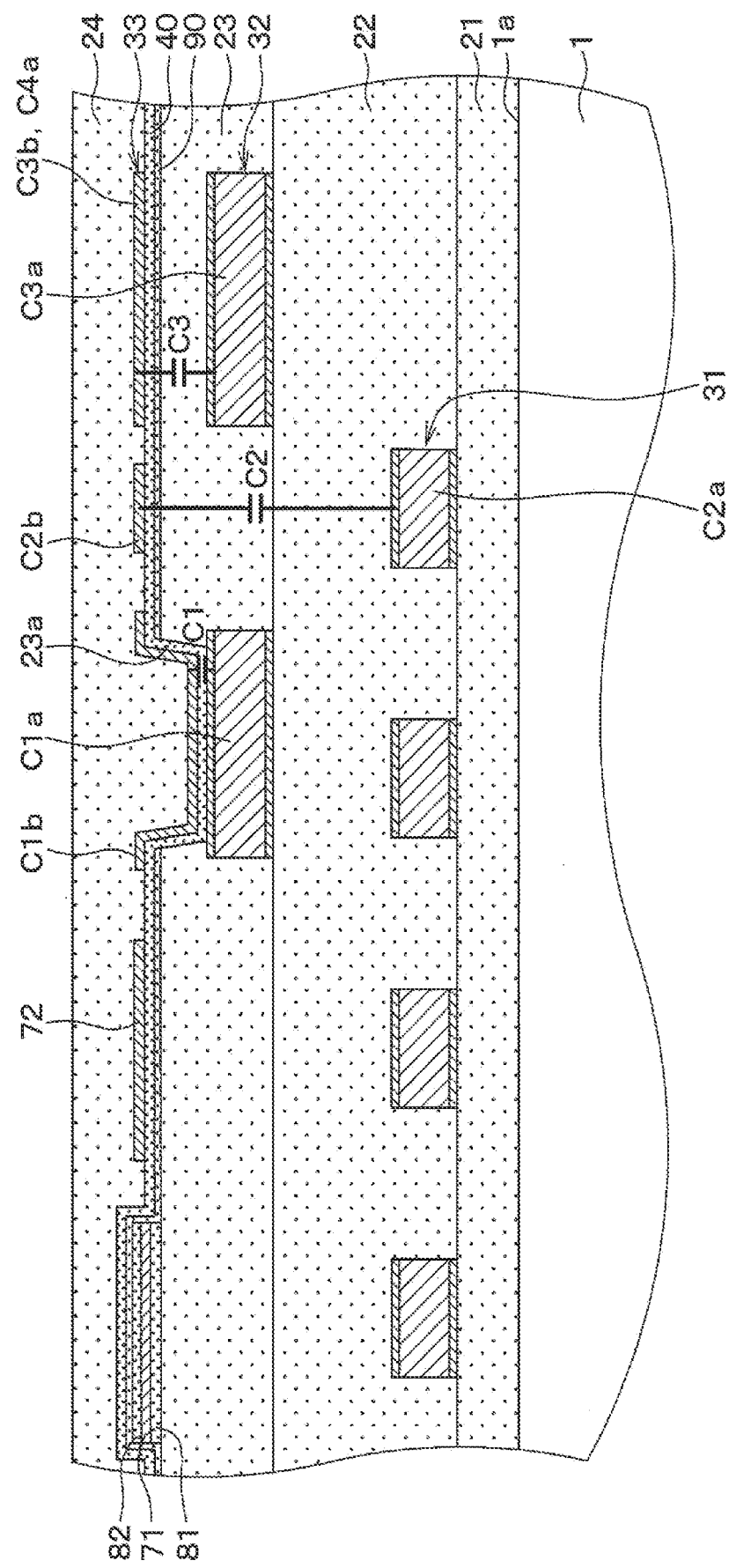

SEMICONDUCTOR DEVICE WITH MULTIPLE METAL-INSULATOR-METAL CAPACITORS AND METHOD FOR MANUFACTURING THE SAME

CROSS REFERENCE TO RELATED APPLICATIONS

The present application is a continuation application of International Patent Application No. PCT/JP2019/014978 filed on Apr. 4, 2019, which designated the U.S. and claims the benefit of priority from Japanese Patent Application No. 2018-076324 filed on Apr. 11, 2018. The entire disclosures of all of the above applications are incorporated herein by reference.

TECHNICAL FIELD

The present disclosure relates to a semiconductor device having a plurality of capacitors of a metal-insulator-metal (hereinafter, referred to as MIM) structure, and a method for manufacturing the semiconductor device.

BACKGROUND

There is a semiconductor device including a capacitor of the MIM structure. Such a semiconductor device has a substrate on which a semiconductor element such as a diode or a transistor is formed. For example, the capacitor is made of a first electrode and an upper electrode stacked on the substrate across a capacitance layer.

SUMMARY

The present disclosure describes a semiconductor device having a plurality of capacitors with different capacitances, and a method for manufacturing the semiconductor device.

BRIEF DESCRIPTION OF DRAWINGS

Features and advantages of the present disclosure will become more apparent from the following detailed description made with reference to the accompanying drawings, in which:

FIG. 6F is a sectional view illustrating the manufacturing process of the semiconductor device following FIG. 6E;

DETAILED DESCRIPTION

Figure 1:
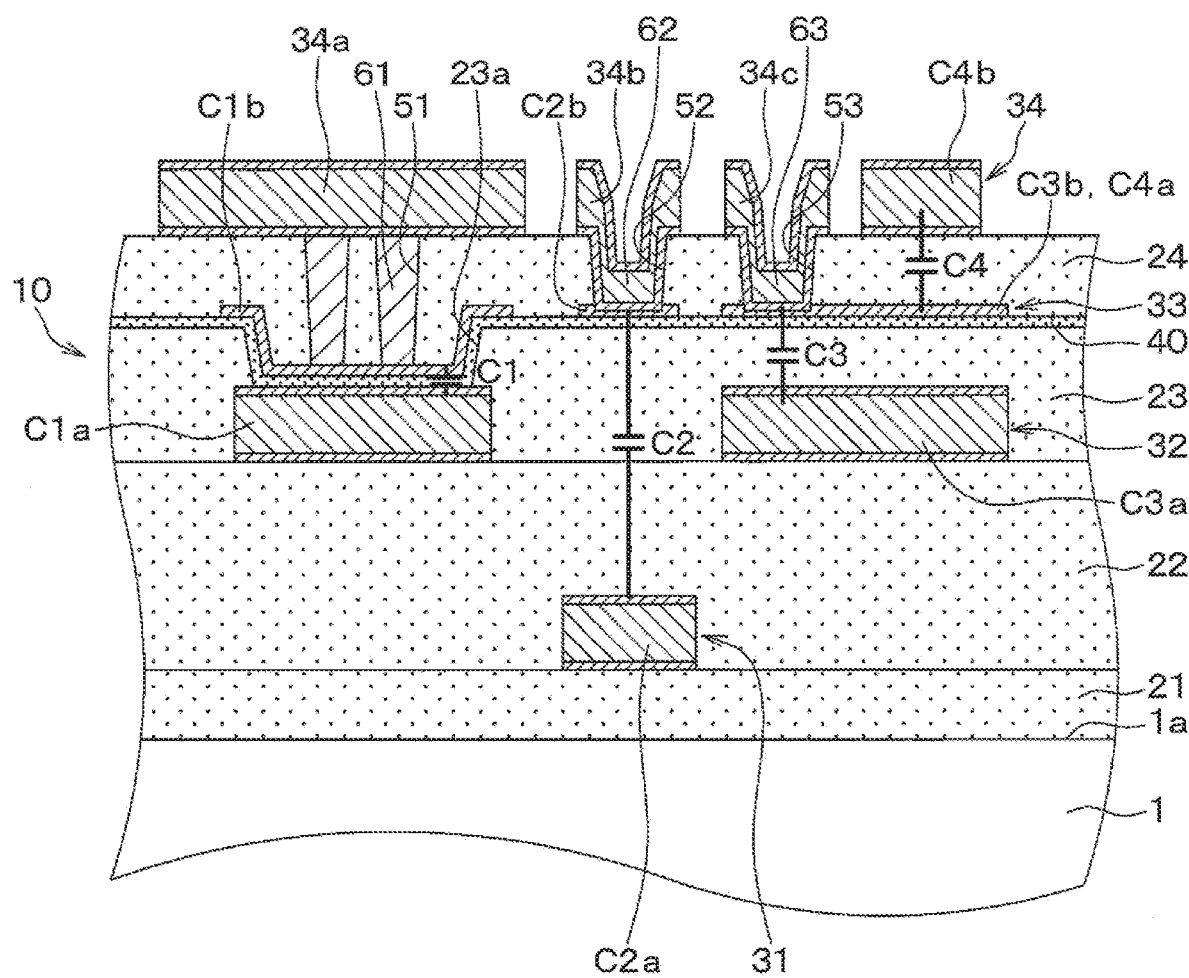
FIG. 1 is a sectional view of a semiconductor device according to a first embodiment.

In a semiconductor device, there is a demand to have a plurality of capacitors with different capacitances.

A semiconductor device according to an embodiment of the present disclosure includes a substrate having one surface, and an interconnection layer disposed on the one surface of the substrate. The interconnection layer includes a plurality of capacitors each having a metal-insulator-metal structure. The interconnection layer has a plurality of insulating films and a plurality of interconnection parts alternately stacked in a stacked direction. Each of the capacitors includes a first electrode and a second electrode provided by any two of the plurality of interconnection parts opposed to each other in the stacked direction, in which the first electrode is one of the two interconnection parts located adjacent to the substrate and the second electrode is the other located opposite to the substrate with respect to the first electrode. Among the plurality of capacitors, one of the first electrode and the second electrode of each capacitor is provided by a same one of the interconnection parts as a subject electrode, and a distance between the first electrode and the second electrode is different among the plurality of capacitors to have different capacitances among the plurality of capacitors. The subject electrodes of the plurality of capacitors provided by the same one of the interconnection parts are covered with at least one of the insulating films, and have ends located on a same plane.

In such a configuration, the capacitors are designed such that one of the first and second electrodes of each capacitor is formed of the same interconnection part as the subject electrode, and the subject electrodes of the respective capacitors have ends located on the same plane. Such subject electrodes may be formed by pattering a metal layer. In such a case, the subject electrodes provided by the same interconnection part can be formed at a time, and thus a manufacturing process can be simplified.

A method for manufacturing a semiconductor device according to an embodiment of the present disclosure, includes preparing a substrate having one surface, and forming an interconnection layer by alternately repeating formation of an insulating film and formation of an interconnection part. The formation of the interconnection part includes forming a metal layer, and forming the subject electrodes of the respective capacitors at a time by patterning the metal layer through dry etching such that the ends of the subject electrodes are located on the same plane. After the forming of the subject electrodes, at least one insulating film is formed.

In such a method, the subject electrodes of the respective capacitors are formed of the same metal layer, and the ends of the subject electrodes are located on the same plane. It is therefore possible to form the subject electrodes of the respective capacitors at a time, leading to a simple manufacturing process. Since the ends of the subject electrodes are located on the same plane, it is possible to suppress defocusing in photoresist processing during dry etching and thus suppress a variation in shape of each electrode.

Hereinafter, embodiments of the present disclosure will be further described with reference to the accompanying drawings. In the following embodiments, the same or equivalent parts are designated by like reference signs for explanation.

First Embodiment

A configuration of a semiconductor device of a first embodiment is described with reference to FIGS. 1 and 2. The semiconductor device of the first embodiment is preferably applied to an analog-to-digital converter (hereinafter, referred to as A/D converter) and the like.

As illustrated in FIG. 1, the semiconductor device includes a substrate 1 made of a silicon substrate or the like. The substrate 1 is formed with semiconductor elements such as a diode and a transistor, though not specifically illustrated. An interconnection layer 10 having a plurality of capacitors each having an MIM structure is formed on one surface 1a of the substrate 1. In the first embodiment, the interconnection layer 10 has therein first to fourth capacitors C1 to C4 with different capacitances as the capacitors of the MIM structure.

In FIG. 1, the first capacitor C1, the second capacitor C2, the third capacitor C3, and the fourth capacitor C4 are illustrated in this order from the left side on the paper. FIG. 1 is a sectional view taken along a line I-I in FIG. 2.

Specifically, a first interlayer insulating film 21 is formed on the one surface 1a of the substrate 1. The first interlayer insulating film 21 is formed of a silicon oxide ($SiO_2$) film, a carbon-added silicon oxide (SiOC) film, a fluorine-added silicon oxide (SiOF) film, a tetraethoxysilane (TEOS) film, or the like.

A first interconnection part 31 is formed on the first interlayer insulating film 21. In the first embodiment, the first interconnection part 31 contains a portion forming a second lower electrode C2a of the second capacitor C2. The first interconnection part is made of typical electrode materials. In the first embodiment, the first interconnection part 31 is made of a stack of titanium nitride (TiN), aluminum (Al), and titanium nitride.

A second interlayer insulating film 22 having the same configuration as the first interlayer insulating film 21 is formed on the first interlayer insulating film 21 to cover the first interconnection part 31. A second interconnection part 32 having the same configuration as the first interconnection part 31 is formed on the second interlayer insulating film 22. In the first embodiment, the second interconnection part 32 includes a first lower electrode C1a to form the first capacitor C1 and a third lower electrode C3a to form the third capacitor C3.

A third interlayer insulating film 23 having the same configuration as the first interlayer insulating film 21 is formed on the second interlayer insulating film 22 to cover the second interconnection part 32. A hole 23a is formed in the third interlayer insulating film 23 to expose the first lower electrode C1a of the second interconnection part 32. In the first embodiment, the hole 23a is a through-hole having a tapered shape having a width gradually narrowed from an opening side toward the first lower electrode C1a.

A capacitance film 40 is formed on the third interlayer insulating film 23. The capacitance film 40 is made of a silicon oxide film, a silicon nitride film (SiN), a tantalum oxide ($Ta_2O_5$) film, or the like. The capacitance film 40 is also formed on a wall surface of the hole 23a and on the first lower electrode C1a exposed from the hole 23a.

A third interconnection part 33 is formed on the capacitance film 40. Specifically, the third interconnection part 33 includes a first upper electrode C1b disposed at a portion opposed to the first lower electrode C1a to configure the first capacitor C1 and a second upper electrode C2b disposed at a portion opposed to the second lower electrode C2a to configure the second capacitor C2. The third interconnection part 33 further includes a third upper electrode C3b disposed at a portion opposed to the third lower electrode C3a to configure the third capacitor C3. In the first embodiment, the third interconnection part 33 is a single-layer interconnection part made of titanium nitride.

In the first embodiment, the first capacitor C1 is made of the first lower electrode C1a, the first upper electrode C1b, and the capacitance film 40 between the first lower electrode C1a and the first upper electrode C1b. In the first capacitor C1, the capacitance film 40 between the first lower electrode C1a and the first upper electrode C1b serves as a capacitance layer. In the first capacitor C1, the first lower electrode C1a corresponds to the first electrode and the first upper electrode C1b corresponds to the second electrode.

The second capacitor C2 is made of the second lower electrode C2a, the second upper electrode C2b, and the second interlayer insulating film 22, the third interlayer insulating film 23, and the capacitance film 40 between the second lower electrode C2a and the second upper electrode C2b. In the second capacitor C2, the second interlayer insulating film 22, the third interlayer insulating film 23, and the capacitance film 40 between the second lower electrode C2a and the second upper electrode C2b collectively serve as a capacitance layer. In the second capacitor C2, the second lower electrode C2a corresponds to the first electrode and the second upper electrode C2b corresponds to the second electrode.

The third capacitor C3 is made of the third lower electrode C3a, the third upper electrode C3b, and the third interlayer insulating film 23 and the capacitance film 40 between the third lower electrode C3a and the third upper electrode C3b. In the third capacitor C3, the third interlayer insulating film 23 and the capacitance film 40 between the third lower electrode C3a and the third upper electrode C3b collectively serve as a capacitance layer. In the third capacitor C3, the third lower electrode C3a corresponds to the first electrode and the third upper electrode C3b corresponds to the second electrode.

Such first to third capacitors C1 to C3 have different distances between the first to third lower electrodes C1a to C3a and the first to third upper electrodes C1b to C3b, respectively. As a result, the first to third capacitors C1 to C3 have different capacitances.

Specifically, the first capacitor C1 is a high-capacity capacitor having a distance between the first lower electrode C1a and the first upper electrode C1b, which is smaller than a distance between the second lower electrode C2a and the second upper electrode C2b and than a distance between the third lower electrode C3a and the third upper electrode C3b. The second and third capacitors C2 and C3 are high-breakdown-voltage capacitors having the distance between the second lower electrode C2a and the second upper electrode C2b and the distance between the third lower electrode C3a and the third upper electrode C3b, respectively, the distances each being larger than the distance between the first lower electrode C1a and the first upper electrode C1b. In the first to third capacitors C1 to C3, the configurations of the capacitance layers disposed between the first to third lower electrodes C1a to C3a and the first to third upper electrodes C1b to C3b are different, respectively. Hence, the first to third capacitors C1 to C3 have different capacitances also in this respect.

Figure 2:
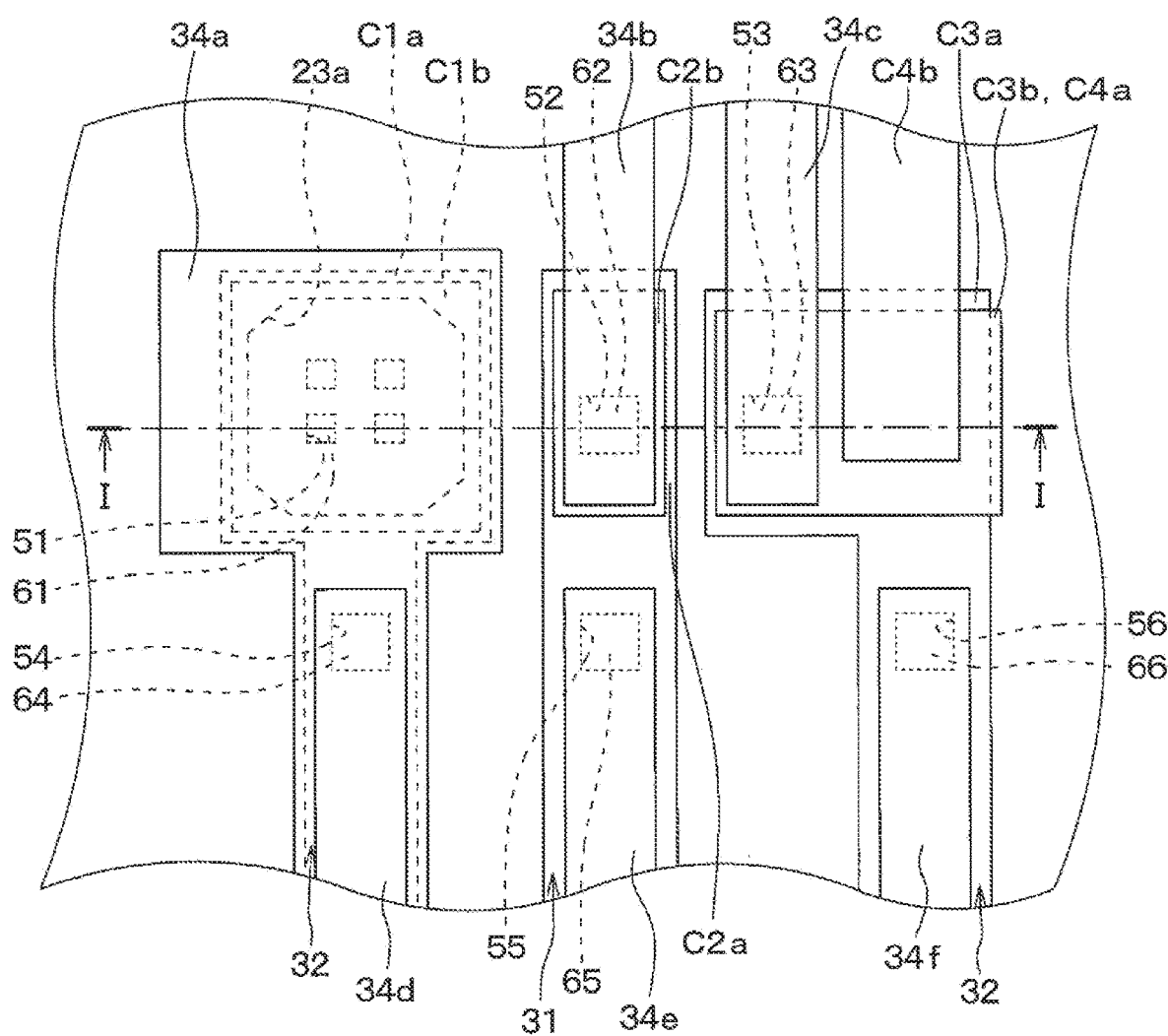
FIG. 2 is a schematic plan view illustrating a positional relationship between a first interconnection part, a second interconnection part, a third interconnection part, and an upper-layer interconnection part shown in FIG. 1.

As illustrated in FIGS. 1 and 2, the first to third upper electrodes C1b to C3b each have a rectangular shape in plan view while having ends located on the same plane. That is, although the first upper electrode C1b is disposed in the hole 23a so as to be opposed to the first lower electrode C1a, its end is extended to the periphery of the hole 23a so as to be located on the same plane as the ends of the second and third upper electrodes C2b and C3b. In other words, the first to third upper electrodes C1b to C3b are formed by patterning of a metal layer 33a by dry etching as described later such that ends of the patterned portions are located on the same plane.

The "same plane" herein means the same height from the substrate 1. In addition, the "same plane" herein is not limited to the exactly the same plane but may include nearly the same plane allowing manufacturing error in a manufacturing process as described later. Further, the ends of the first to third upper electrodes C1b to C3b mean portions containing the respective boundaries between surfaces extending parallel to the one surface 1a and surfaces intersecting the one surface 1a of the first to third upper electrodes C1b to C3b.

A fourth interlayer insulating film 24 is disposed on the capacitance film 40 to cover the third interconnection part 33. That is, the first to third upper electrodes C1b to C3b of the third interconnection part 33 are covered with the fourth interlayer insulating film 24. The fourth interlayer insulating film 24 has a first via hole 51 to expose the first upper electrode C1b, a second via hole 52 to expose the second upper electrode C2b, and a third via hole 53 to expose the third upper electrode C3b. As illustrated in FIG. 2, a fourth via hole 54 is provided through the third and fourth interlayer insulating films 23 and 24 in a cross section different from that of FIG. 1 to expose the second interconnection part 32 forming the first lower electrode C1a. A fifth via hole 55 is formed through the second to fourth interlayer insulating films 22 to 24 to expose the first interconnection part 31 forming the second lower electrode C2a. A sixth via hole 56 is formed through the third and fourth interlayer insulating films 23 and 24 to expose the second interconnection part 32 forming the third lower electrode C3a.

The first to sixth via holes 51 to 56 are filled with first to sixth connection vias 61 to 66, respectively. The first and fourth to sixth via holes 51 and 54 to 56 each have a larger depth than each of the second and third via holes 52 and 53. The first and fourth to sixth connection vias 61 and 64 to 66 are therefore formed of a highly fillable tungsten plug. The second and third connection vias 62 and 63 are each formed by filling with a later-described upper-layer interconnection part 34.

The upper-layer interconnection part 34 having the same configuration as the first interconnection part 31 is disposed on the fourth interlayer insulating film 24. The upper-layer interconnection part 34 includes a first upper-layer interconnection part 34a to be connected to the first connection via 61, a second upper-layer interconnection part 34b to be connected to the second connection via 62, and a third upper-layer interconnection part 34c to be connected to the third connection via 63. The upper-layer interconnection part 34 further includes a fourth upper-layer interconnection part 34d to be connected to the fourth connection via 64, a fifth upper-layer interconnection part 34e to be connected to the fifth connection via 65, and a sixth upper-layer interconnection part 34f to be connected to the sixth connection via 65.

Further, the upper-layer interconnection part 34 is disposed to be opposed to part of the third upper electrode C3b so as to contain the fourth upper electrode C4b to form the fourth capacitor C4. This results in formation of the fourth capacitor C4 having the third upper electrode C3b, the fourth upper electrode C4b, and the fourth interlayer insulating film 24 between the third upper electrode C3b and the fourth upper electrode C4b. That is, the third upper electrode C3b also serves as the fourth lower electrode C4a. Although the third upper electrode C3b also serves as the fourth lower electrode C4a, it may be hereinafter simply referred to as third upper electrode C3b in case of being simply shown as part of the third interconnection part 33. In the fourth capacitor C4, the fourth lower electrode C4a corresponds to the first electrode, and the fourth upper electrode C4b corresponds to the second electrode.

The fourth capacitor C4 has an opposed distance different from that of each of the first and second capacitors C1 and C2 and an opposed area different from that of the third capacitor C3. The first to fourth capacitors therefore have different capacitances. In the first embodiment, the third and fourth interlayer insulating films 23 and 24 have different thicknesses, thereby the respective third and fourth capacitors C3 and C4 have different opposed distances.

The above is the configuration of the semiconductor device of the first embodiment. The first to third interconnection parts 31 to 33 and the upper-layer interconnection part 34 are each formed by patterning a metal layer by dry etching as described later. Hence, a distance between an end of an upper interconnection part and a lower interconnection part is preferably 100 nm or more in a stacked direction of the first to third interconnection parts 31 to 33 and the upper-layer interconnection part 34 (hereinafter, simply referred to as the stacked direction) so as to restrict the lower interconnection part from being removed due to manufacturing error or the like. For example, as illustrated in FIGS. 1 and 2, the fourth capacitor C4 is disposed such that the fourth lower electrode C4a has a portion projecting from the fourth upper electrode C4b when viewed in the stacked direction. In this case, the distance between the fourth lower electrode C4a and the fourth upper electrode C4b is preferably adjusted to 100 nm or more so as to restrict the fourth lower electrode C4a from being removed due to manufacturing error or the like during formation of the fourth upper electrode C4b by dry etching.

The first to third interconnection parts 31 to 33 and the upper-layer interconnection part 34 are also appropriately provided in a cross section different from that of FIG. 1. The interconnection parts 31 to 34 are electrically connected together through connection vias appropriately formed in the first to fourth interlayer insulating films 21 to 24. A method for manufacturing the semiconductor device is now described.

Figure 3A:
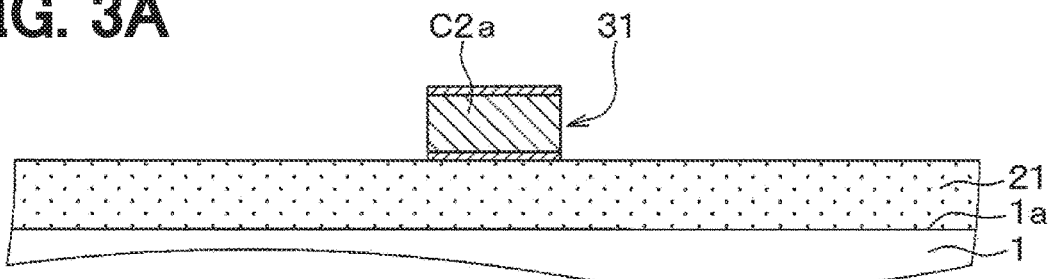
FIG. 3A is a sectional view illustrating a manufacturing process of the semiconductor device shown in FIG. 1.

First, as illustrated in FIG. 3A, the substrate 1 formed with a semiconductor element therein is prepared, and the first interlayer insulating film 21 is formed on the one surface 1a of the substrate 1 by a chemical vapor deposition (CVD) process, for example. A metal layer as a stack of titanium nitride, aluminum, and titanium nitride is then formed on the first interlayer insulating film 21 by a sputter process, for example. Subsequently, a mask (not illustrated) formed of a photoresist is placed on the metal layer and dry etching is performed to form the first interconnection part 31 having the second lower electrode C2a.

Figure 3B:
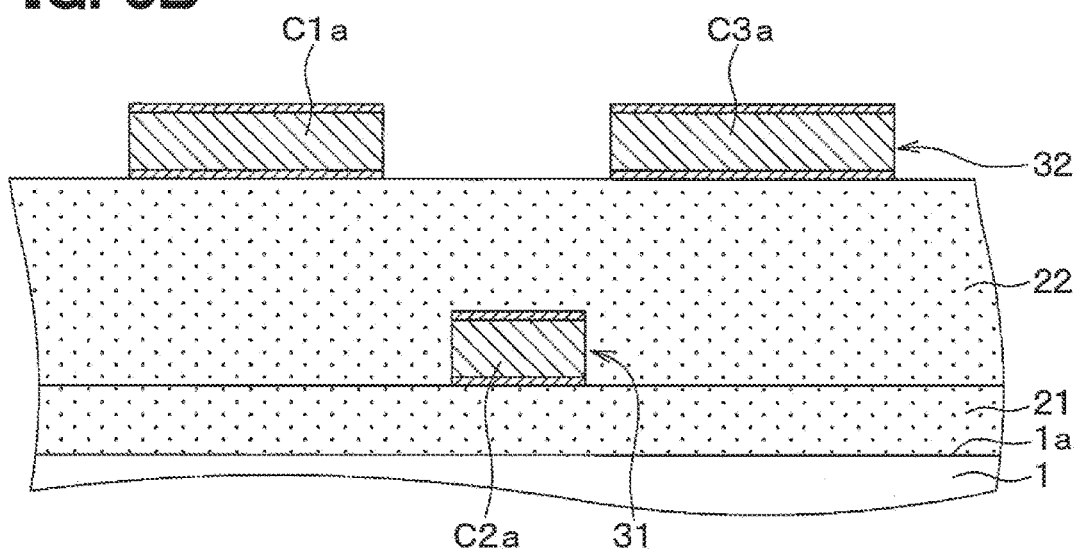
FIG. 3B is a sectional view illustrating the manufacturing process of the semiconductor device following FIG. 3A.

Subsequently, as illustrated in FIG. 3B, the second interlayer insulating film 22 is formed on the first interlayer insulating film 21 to cover the first interconnection part 31 by a CVD process or the like. Subsequently, a surface of the second interlayer insulating film 22 on a side opposite to the substrate 1 is appropriately planarized by a chemical mechanical polishing (CMP) process or the like. A metal layer as a stack of titanium nitride, aluminum, and titanium nitride is then formed on the second interlayer insulating film 22 by a sputter process or the like. Subsequently, a mask (not illustrated) formed of a photoresist is placed on the metal layer and dry etching is performed to form the second interconnection part 32 including the first lower electrode C1a and the third lower electrode C3a.

Figure 3C:
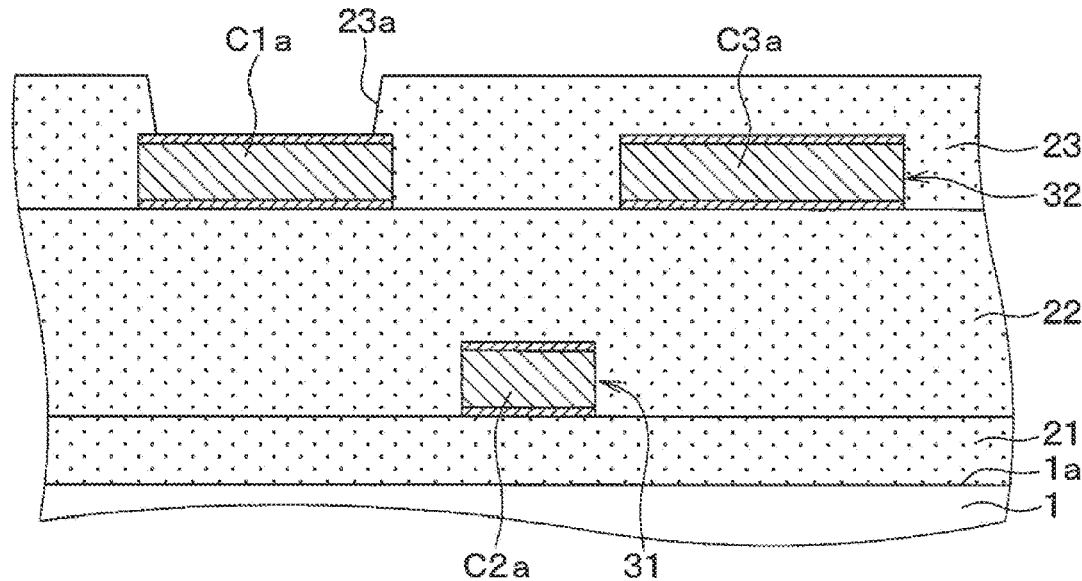
FIG. 3C is a sectional view illustrating the manufacturing process of the semiconductor device following FIG. 3B.

Subsequently, as illustrated in FIG. 3C, the third interlayer insulating film 23 is formed on the second interlayer insulating film 22 by a CVD process or the like to cover the second interconnection part 32. Subsequently, a surface of the third interlayer insulating film 23 on a side opposite to a substrate 1 is appropriately planarized by a CMP process or the like. Subsequently, a mask (not illustrated) formed of a photoresist is placed on the third interlayer insulating film 23 and dry etching is performed to form the hole 23a to expose the first lower electrode C1a.

Figure 3D:
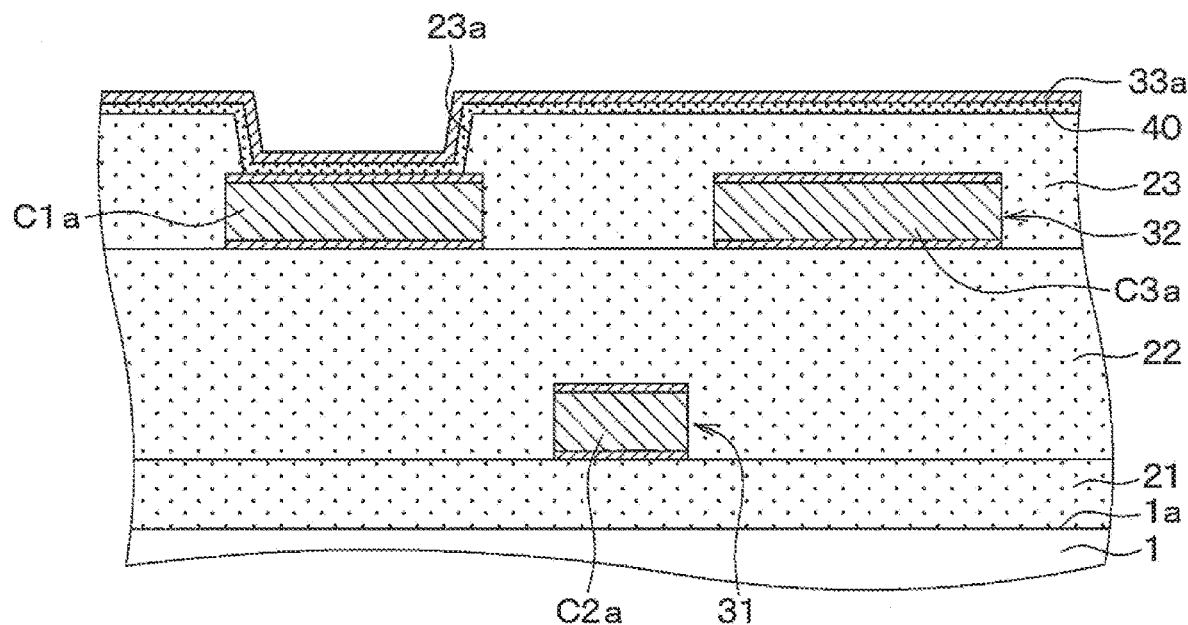
FIG. 3D is a sectional view illustrating the manufacturing process of the semiconductor device following FIG. 3C.

Subsequently, as illustrated in FIG. 3D, the capacitance film 40 is formed by a CVD process or the like. Subsequently, the metal layer 33a made of titanium nitride is formed on the capacitance film 40 by a sputter process or the like.

Figure 3E:
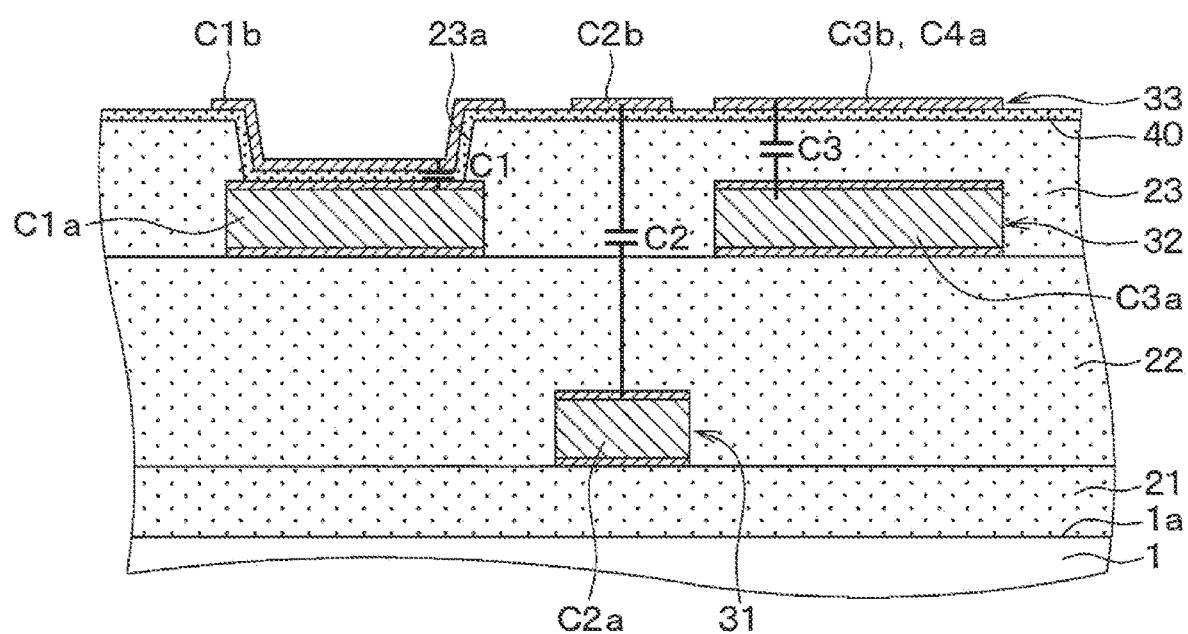
FIG. 3E is a sectional view illustrating the manufacturing process of the semiconductor device following FIG. 3D.

Subsequently, as illustrated in FIG. 3E, a mask (not illustrated) formed of a photoresist is placed and dry etching is performed to form the third interconnection part 33 including the first upper electrode C1b, the second upper electrode C2b, and the third upper electrode C3b (or fourth lower electrode C4a). Consequently, the first capacitor C1 is formed so as to include the first lower electrode C1a and the first upper electrode C1b. In addition, the second capacitor C2 is formed so as to include the second lower electrode C2a and the second upper electrode C2b, and the third capacitor C3 is formed so as to include the third lower electrode C3a and the third upper electrode C3b.

In this case, the first upper electrode C1b is formed such that its end is extended to the periphery of the hole 23a. That is, the first upper electrode C1b is formed such that the end is located on the same plane as the second upper electrode C2b and the third upper electrode C3b. In other words, the first to third upper electrodes C1b to C3b are formed such that ends of portions removed by dry etching are on the same plane. This makes it possible to suppress defocusing in photoresist processing during dry etching of the metal layer 33a. It is therefore possible to suppress a variation in shape of each of the first to third upper electrodes C1b to C3b.

Figure 3F:
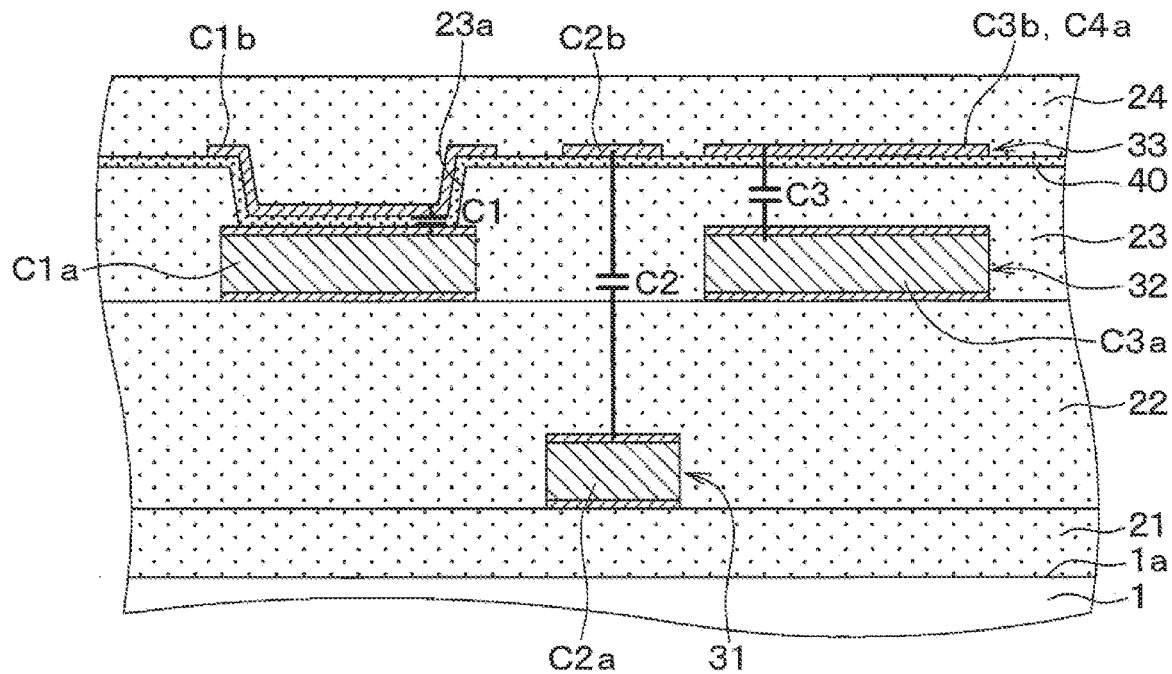
FIG. 3F is a sectional view illustrating the manufacturing process of the semiconductor device following FIG. 3E.

Subsequently, as illustrated in FIG. 3F, the fourth interlayer insulating film 24 is formed on the third interlayer insulating film 23 by a CVD process or the like to cover the third interconnection part 33.

Figure 3G:
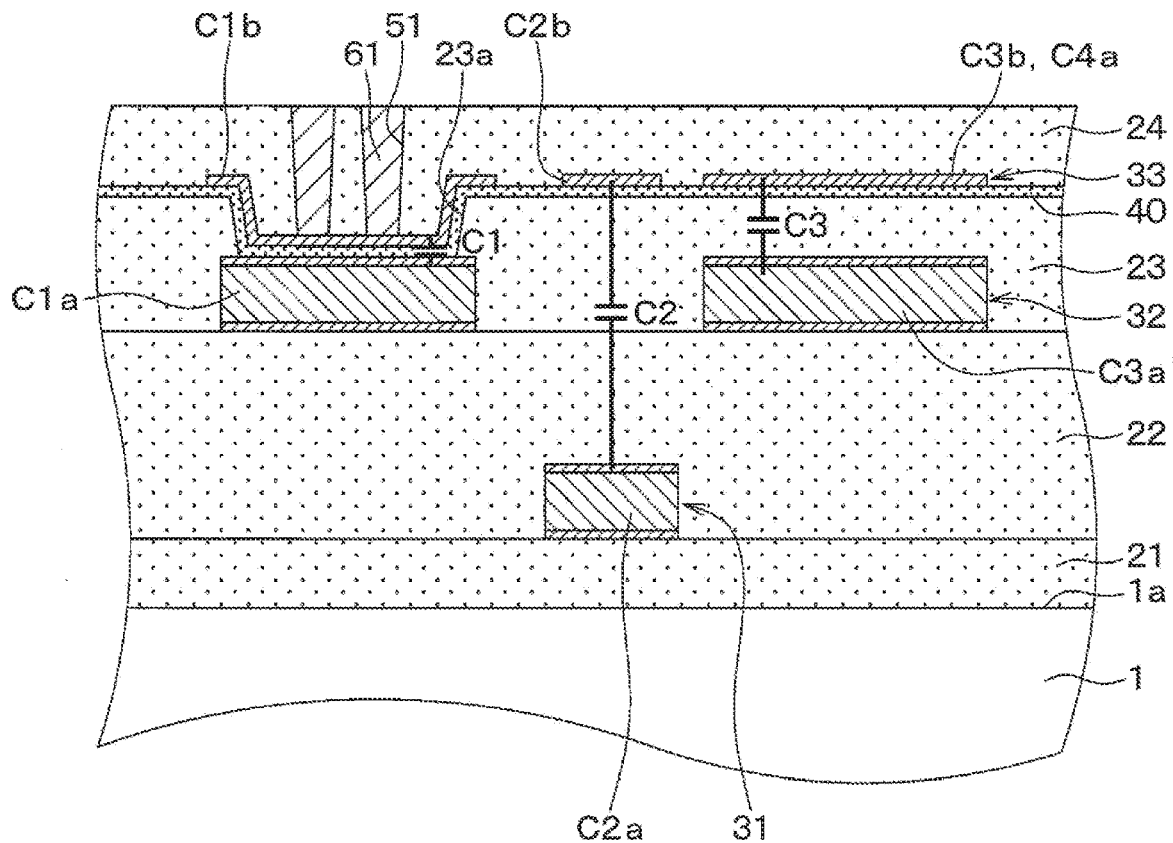
FIG. 3G is a sectional view illustrating the manufacturing process of the semiconductor device following FIG. 3F.

Subsequently, as illustrated in FIG. 3G, a mask (not illustrated) formed of a photoresist is placed on the fourth interlayer insulating film 24 and dry etching is performed to form the first via hole 51 in the fourth interlayer insulating film 24. Subsequently, the first via hole 51 is filled with tungsten by a physical vapor deposition (PVD) process, a CVD process, or the like to form the first connection via 61. While not illustrated, dry etching is appropriately performed to form the fourth to sixth via holes 54 to 56 that are then filled with tungsten to form the fourth to sixth connection vias 64 to 66.

Figure 3H:
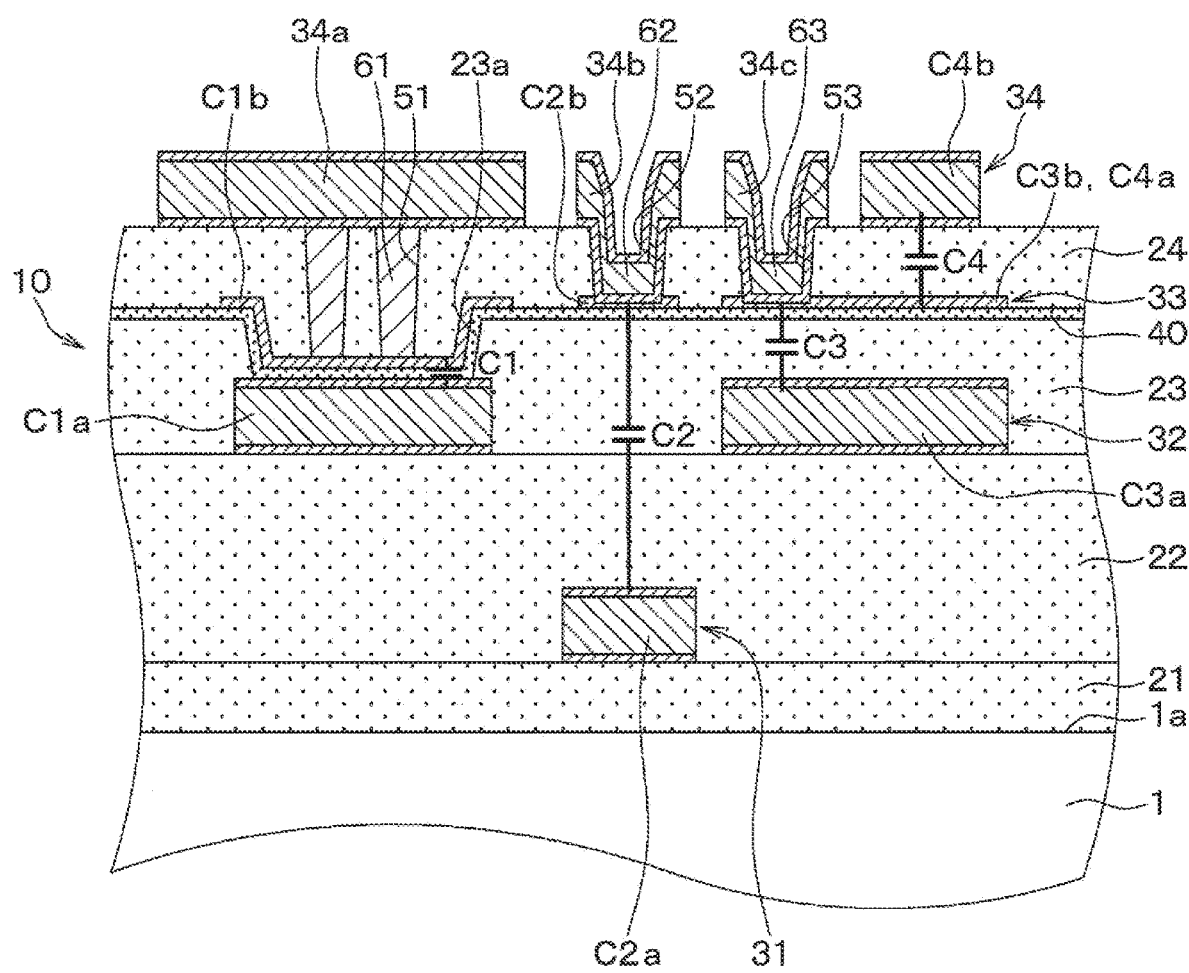
FIG. 3H is a sectional view illustrating the manufacturing process of the semiconductor device following FIG. 3G.

Subsequently, as illustrated in FIG. 3H, a mask (not illustrated) formed of a photoresist is placed on the fourth interlayer insulating film 24 and dry etching is performed to form the second via hole 52 and the third via hole 53. A metal layer as a stack of titanium nitride, aluminum, and titanium nitride is then formed on the fourth interlayer insulating film 24 by a sputter process or the like. In this case, the second and third via holes 52 and 53 are filled with the metal layer to form the second and third connection vias 62 and 63, respectively. Subsequently, a mask (not illustrated) formed of a photoresist is placed on the metal layer and dry etching is performed to form the upper-layer interconnection part 34 including the first to sixth upper-layer interconnection parts 34a to 34f and the fourth upper electrode C4b. As a result, the fourth capacitor C4 including the fourth lower electrode C4a and the fourth upper electrode C4b is formed. Thus, the semiconductor device is manufactured.

As described above, in the first embodiment, the first upper electrode C1b, the second upper electrode C2b, and the third upper electrode C3b (or fourth lower electrode C4a) are formed by dry etching of the common metal layer 33a. This makes it possible to simplify a manufacturing process compared with a case where the first upper electrode C1b, the second upper electrode C2b, and the third upper electrode C3b (or fourth lower electrode C4a) are separately formed.

The first upper electrode C1b, the second upper electrode C2b, and the third upper electrode C3b (or fourth lower electrode C4a) have respective ends located on the same plane. That is, the first upper electrode C1b, the second upper electrode C2b, and the third upper electrode C3b (or fourth lower electrode C4a) are formed by dry-etching the metal layer 33a such that ends of these electrodes are located on the same plane. This makes it possible to suppress defocusing in photoresist processing during dry etching of the metal layer 33a. It is therefore possible to suppress a variation in characteristics of each of the first to fourth capacities C1 to C4. In this case, the first upper electrode C1b, the second upper electrode C2b, the third upper electrode C3b and the fourth lower electrode C4a are provided by the same interconnection part, so that ends thereof are on the same plane. In other words, among the first to fourth capacitors C1 to C4, one of the first electrode and the second electrode of respective capacitor is provided by the same interconnection part, and the one of the first electrode and the second electrode of respective capacitor provided by the same interconnection part will be referred to as a subject electrode for convenience of explanation.

The first to third interconnection parts 31 to 33 and the upper-layer interconnection part 34 are formed in separate steps. This makes it possible to suppress defocusing in photoresist processing compared with a case where different interconnection parts are formed at a time by dry etching or the like, leading to accurate formation of the interconnection parts.

Further, the semiconductor device of the first embodiment has the high-capacity capacitor including the first capacitor C1 and the high-breakdown-voltage capacitors including the second to fourth capacitors C2 to C4. It is therefore possible to incorporate the first capacitor C1 in an AD converter requiring high accuracy and incorporate the second to fourth capacitors C2 to C4 in a battery monitor or the like requiring high breakdown voltage. That is, in the semiconductor device of the first embodiment, capacitors to be incorporated in different units are formed on the common substrate 1, and thus size reduction can be achieved compared with a case of separately forming the high-capacity capacitor and the high-breakdown-voltage capacitors. In other words, the first embodiment allows the different capacitors to be incorporated in different units to be formed on the common substrate 1.

Second Embodiment

A second embodiment is now described. The second embodiment is different from the first embodiment in that a composite resistor is further disposed in the interconnection layer 10. Other configurations are the same as those of the first embodiment and duplicated description is omitted.

Figure 4:
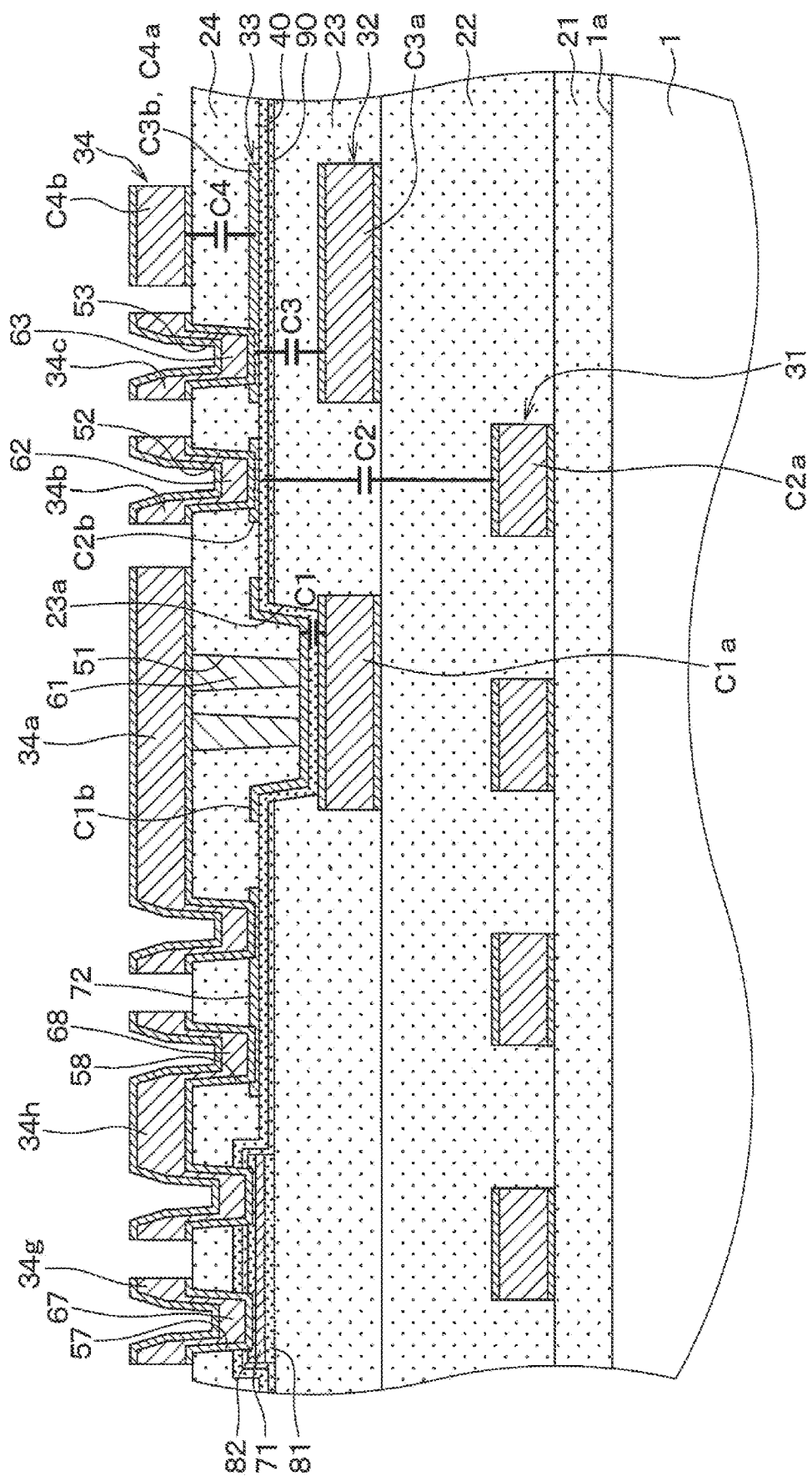
FIG. 4 is a sectional view of a semiconductor device according to a second embodiment.
Figure 5:
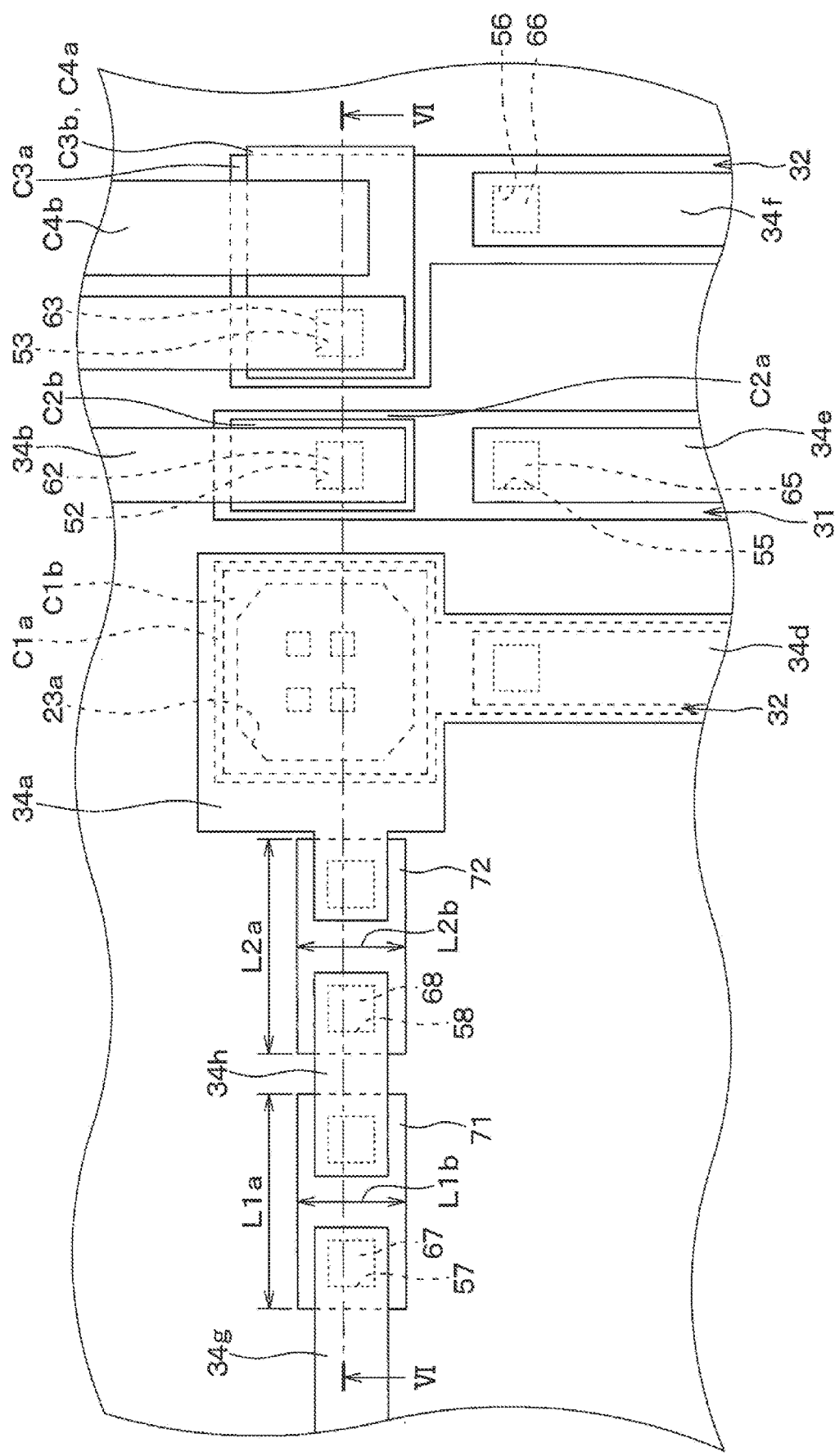
FIG. 5 is a schematic plan view illustrating a positional relationship between a first interconnection part, a second interconnection part, a third interconnection part, and an upper-layer interconnection part shown in FIG. 4.

As illustrated in FIGS. 4 and 5, the semiconductor device of the second embodiment has a first resistor 71 having a predetermined temperature coefficient of resistance and a second resistor 72 having a temperature coefficient of resistance different from that of the first resistor 71 on the third interlayer insulating film 23.

In the second embodiment, the first resistor 71 is made of tantalum nitride, and is formed on the third interlayer insulating film 23 with a lower prevention film 81 in between. An upper prevention film 82 is disposed on the first resistor 71. That is, the first resistor 71 is interposed between the lower prevention film 81 and the upper prevention film 82. The lower prevention film 81 and the upper prevention film 82 are each an antioxidation film including a silicon nitride film or a nitrogen-added silicon carbide (SiCN) film having a low water permeability.

A protective film 90 is disposed on the third interlayer insulating film 23 to cover the lower prevention film 81, the first resistor 71, and the upper prevention film 82, and the capacitance film 40 is disposed on the protective film 90. The second and third upper electrodes C2b and C3b are disposed on the capacitance film 40 via the protective film 90. That is, each of the second and third capacitors C2 and C3 includes the capacitance layer containing the protective film 90.

The protective film 90 is not disposed on the side surface and the bottom of the hole 23a. That is, the hole 23a penetrates the third interlayer insulating film 23 and the protective film 90. In the first capacitor C1, therefore, the capacitance layer includes only the capacitance film 40 as in the first embodiment.

The second resistor 72 is disposed on the capacitance film 40 via the protective film 90 and near the first resistor 71. In the second embodiment, the second resistor 72 is located between the first resistor 71 and the first upper electrode C1b. The second resistor 72 is made of titanium nitride, similar to the first to third upper electrodes C1b to C3b. That is, in the second embodiment, the third interconnection part 33 disposed on the capacitance film 40 includes the second resistor 72 in addition to the first to third upper electrodes C1b to C3b. No antioxidation film is disposed under or over the second resistor 72. That is, in the second embodiment, of the first and second resistors 71 and 72, only the first resistor 71 is suppressed from being oxidized.

The fourth interlayer insulating film 24 has two seventh via holes 57 reaching the first resistor 71 and two eighth via holes 58 reaching the second resistor 72.

In the second embodiment, the first resistor 71 and the second resistor 72 each have a rectangular shape in plan view with an array direction of the first resistor 71 and the second resistor 72 (hereinafter, simply referred to as the array direction) as a longitudinal direction. One of the two seventh via holes 57 (i.e., the seventh via hole 57 on the left side on the paper in FIG. 4) reaches a portion on one longitudinal end side of the first resistor 71. The other of the two seventh via holes 57 (i.e., the seventh via hole 57 on the right side on the paper in FIG. 4) reaches a portion on the other longitudinal end side of the first resistor 71.

One of the two eighth via holes 58 (i.e., the eighth via hole 58 on the left side on the paper in FIG. 4) reaches a portion on one longitudinal end side of the second resistor 72. The other of the two eighth via holes 58 (i.e., the eighth via hole 58 on the right side on the paper in FIG. 4) reaches a portion on the other longitudinal end side of the second resistor 72.

The seventh via holes 57 are each filled with a seventh connection via 67 to be electrically connected to the first resistor 71. Similarly, the eighth via holes 58 are each filled with an eighth connection via 68 to be electrically connected to the second resistor 72. The seventh and eighth connection vias 67 and 68 are each formed by filling with the upper-layer interconnection part 34.

The upper-layer interconnection part 34 formed on the fourth interlayer insulating film 24 includes a seventh upper-layer interconnection part 34g to be connected to one of the seventh connection vias 67 and an eighth upper-layer interconnection part 34h to be connected to the other of the seventh connection vias 67 and one of the eighth connection vias 68. Consequently, a composite resistor including the first resistor 71 and the second resistor 72 connected in series is formed. In the second embodiment, the first upper-layer interconnection part 34a of the upper-layer interconnection part 34 is connected to, but not limited to, the other of the eighth connection vias 68. The other of the eighth connection vias 68 may be connected to another part of the upper-layer interconnection part 34.

Configurations of the first and second resistors 71 and 72 of the second embodiment are now described further in detail.

In the second embodiment, the respective first and second resistors 71 and 72 have temperature coefficients of resistance having values with opposite signs. In other words, when the first resistor 71 and the second resistor 72 are connected in series to form the composite resistor, their respective temperature coefficients of resistance are offset by each other.

In the second embodiment, the first resistor 71 has a temperature coefficient of resistance having a negative value and is made of tantalum nitride satisfying $-150<TCR<0$ ppm/° C., where TCR represents temperature coefficient of resistance. The second resistor 72 has a temperature coefficient of resistance having a positive value and is made of titanium nitride satisfying $TCR>300$ ppm/° C. In other words, in the second embodiment, the first resistor 71 has a smaller absolute value of the temperature coefficient of resistance than the second resistor 72.

In the second embodiment, the first resistor 71 has a larger sheet resistance than the second resistor 72. For example, the first resistor 71 has a sheet resistance of 140Ω/□ and a temperature coefficient of resistance of −70 ppm/° C. while the second resistor 72 has a sheet resistance of 20Ω/□ and a temperature coefficient of resistance of 400 ppm/° C. The sheet resistance means a value represented by a ratio of resistivity to thickness.

The first resistor 71 and the second resistor 72 are each defined in shape to give a small total temperature coefficient of resistance of the composite resistor of the resistors 71 and 72 connected in series. For example, when the first resistor 71 and the second resistor 72 are connected in series, the total temperature coefficient of resistance is intended to be about 0 ppm/° C. To achieve this, the first resistor 71 and the second resistor 72 are formed as follows.

That is, as illustrated in FIG. 5, lengths of the first and second resistors 71 and 72 along the array direction are defined as lengths L1a and L2a of the first and second resistors 71 and 72, respectively. Lengths of the first and second resistors 71 and 72 in a direction intersecting the array direction are defined as widths L1b and L2b of the first and second resistors 71 and 72, respectively. When the first and second resistors 71 and 72 having equal lengths L1a and L2a are connected in series to adjust the total temperature coefficient of resistance to 0 ppm/° C., each resistor is formed to have a width proportional to a proportion of the product of a sheet resistance and a temperature coefficient of resistance of the resistor. That is, when the first and second resistors 71 and 72 have the above-described respective sheet resistances and temperature coefficients of resistance, and when the respective first and second resistors 71 and 72 have equal lengths L1a and L2a, the width L2b of the second resistor 72 is adjusted to about 0.8 times of the width L1b of the first resistor 71. Such a configuration achieves the total temperature coefficient of resistance of about 0 ppm/° C.

Similarly, when the first and second resistors 71 and 72 having the equal widths L1b and L2b, respectively, are connected in series to adjust the total temperature coefficient of resistance to 0 ppm/° C., each resistor is formed to have a length inversely proportional to a proportion of the product of a sheet resistance and a temperature coefficient of resistance of the resistor. That is, when the first and second resistors 71 and 72 have the above-described respective sheet resistances and temperature coefficients of resistance, and when the first and second resistors 71 and 72 have equal widths L1b and L2b, respectively, the length L2a of the second resistor 72 is adjusted to 1.23 times larger than the length L1a of the first resistor 71. Such a configuration allows the total temperature coefficient of resistance to be adjusted to 0 ppm/° C. In such a case, in the second embodiment, the first resistor 71 has a larger sheet resistance but a smaller absolute value of the temperature coefficient of resistance than the second resistor 72. This makes it possible to reduce the total temperature coefficient of resistance while suppressing planar shapes of the resistors 71 and 72 from being extremely different from each other.

In the second embodiment, the first resistor 71 has a smaller thickness but a larger resistance value than the second resistor 72. For example, the first resistor 71 has a thickness of about 30 nm, while the second resistor 72 has a thickness of about 90 nm. In other words, in the second embodiment, the first resistor 71 has a larger sheet resistance, a larger resistance value, a smaller absolute value of the temperature coefficient of resistance, and a smaller thickness than the second resistor 72.

The first resistor 71 and the second resistor 72 of the second embodiment are formed by patterning a metal film formed by sputter as described later. The temperature coefficient of resistance is therefore set to a desired value by appropriately adjusting the content of nitrogen during film formation.

The above is the configuration of the semiconductor device of the second embodiment. A method for manufacturing the semiconductor device of the second embodiment is now described.

Figure 6A:
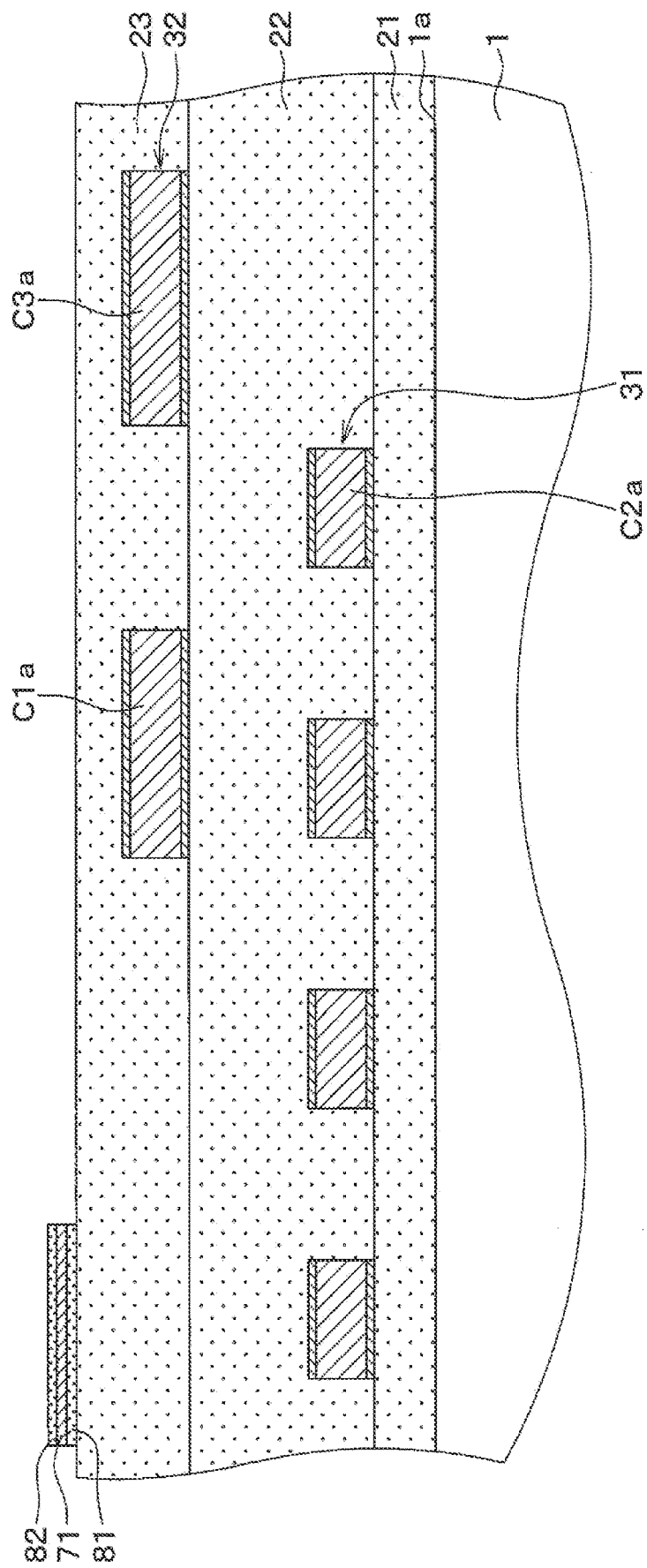
FIG. 6A is a sectional view illustrating a manufacturing process of the semiconductor device shown in FIG. 4.

As illustrated in FIG. 6A, after the steps of FIGS. 3A and 3B, the lower prevention film 81, the first resistor 71, and the upper prevention film 82 are formed in sequence on the third interlayer insulating film 23. Specifically, a lower prevention layer to configure the lower prevention film 81, the metal layer to configure the first resistor 71, an upper prevention layer to configure the upper prevention film 82 are formed in sequence by a CVD process or a sputter process. The metal layer forming the first resistor 71 is formed to satisfy $-150<TCR<0$ ppm/° C. by appropriately adjusting the nitrogen content during sputter.

A mask (not illustrated) is placed on the upper prevention layer and dry etching is performed to integrally form the lower prevention film 81, the first resistor 71, and the upper prevention film 82. Subsequently, the mask is removed by ashing or the like. In this case, the first resistor 71 is restricted from being oxidized by the upper prevention film 82 and the lower prevention film 81.

Figure 6B:
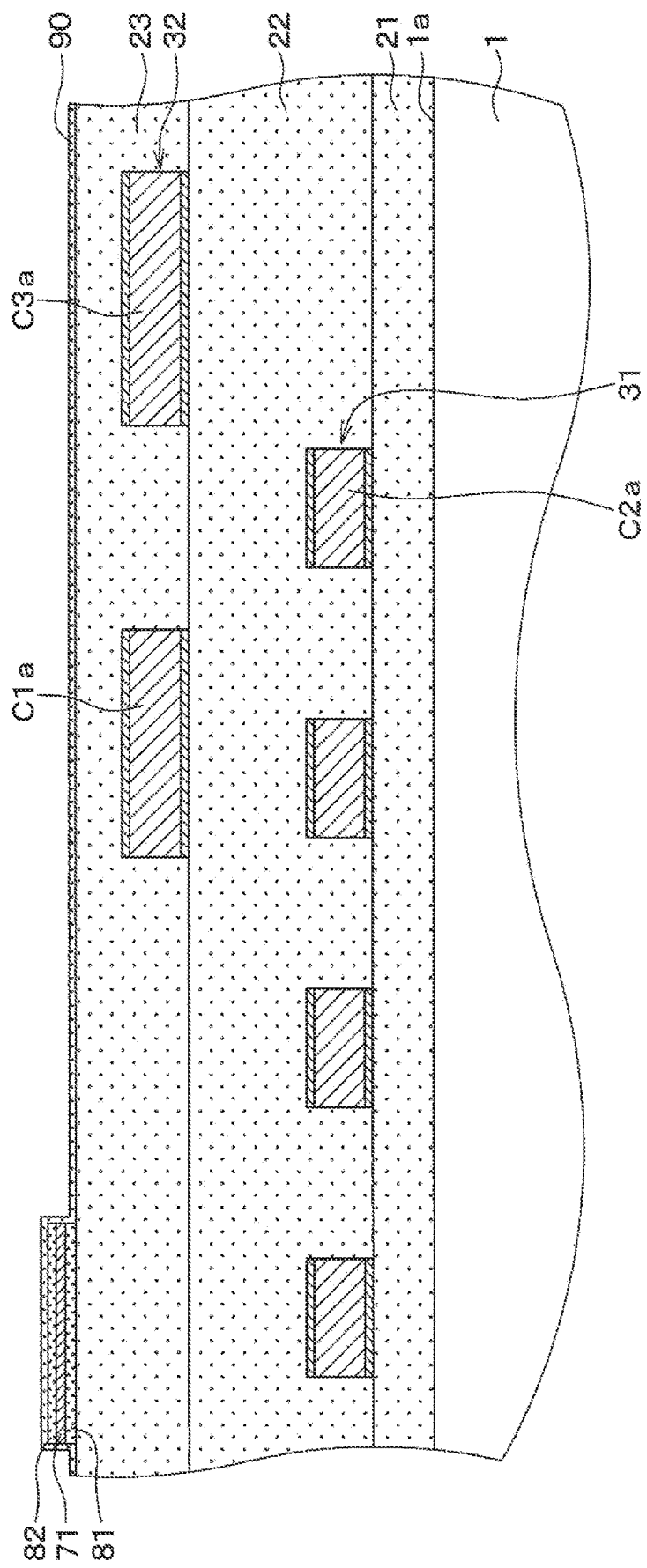
FIG. 6B is a sectional view illustrating the manufacturing process of the semiconductor device following FIG. 6A.

Subsequently, as illustrated in FIG. 6B, the protective film 90 is formed on the third interlayer insulating film 23 to cover the lower prevention film 81, the first resistor 71, and the upper prevention film 82. As a result, side surfaces of the first resistor 71 are also covered with an antioxidation film, and thus the first resistor 71 is restricted from being oxidized in subsequent steps. The protective film 90 may have a thickness enough to cover the side surfaces of the first resistor 71 and is thus thin.

Figure 6C:
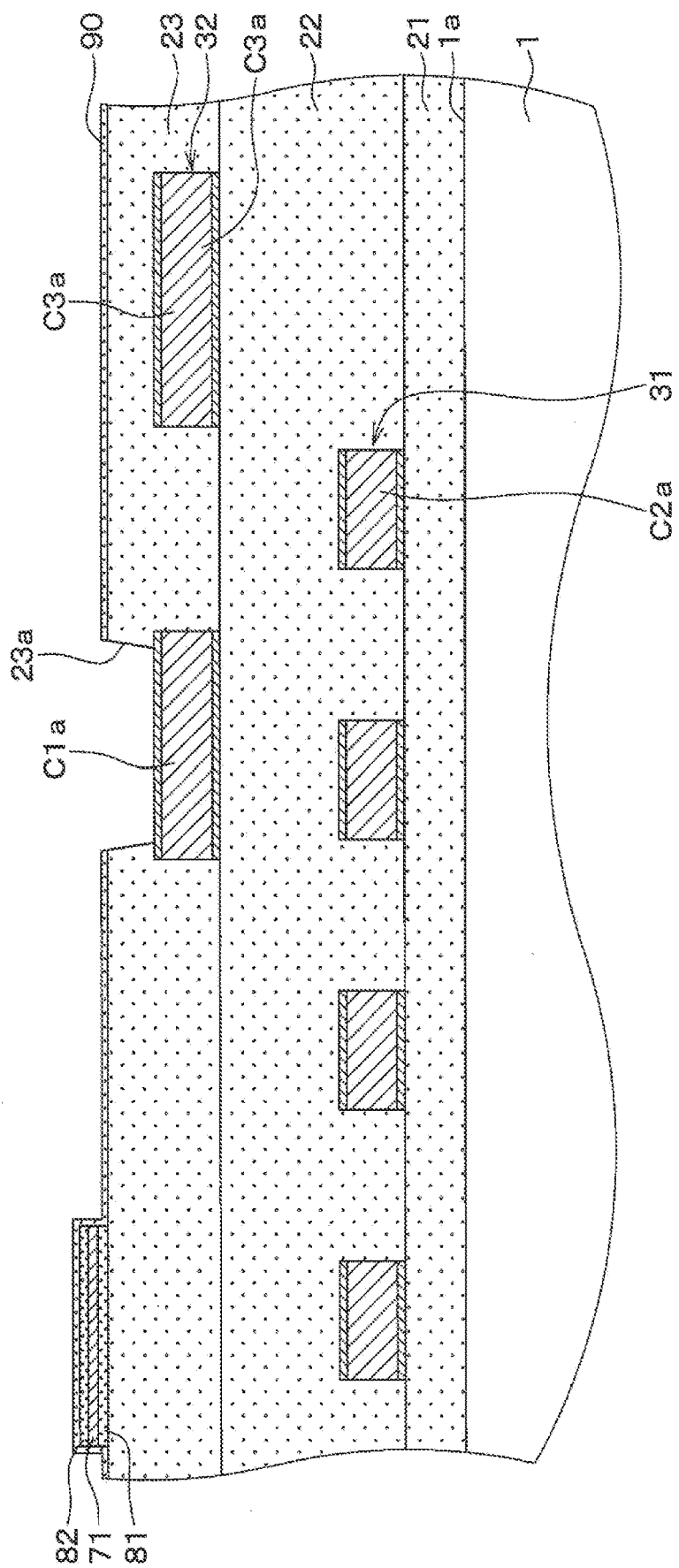
FIG. 6C is a sectional view illustrating the manufacturing process of the semiconductor device following FIG. 6B.

Subsequently, as illustrated in FIG. 6C, a mask (not illustrated) is placed on the protective film 90 and dry etching is performed to form the hole 23a penetrating the protective film 90 and the third interlayer insulating film 23 to expose the first lower electrode C1a.

Figure 6D:
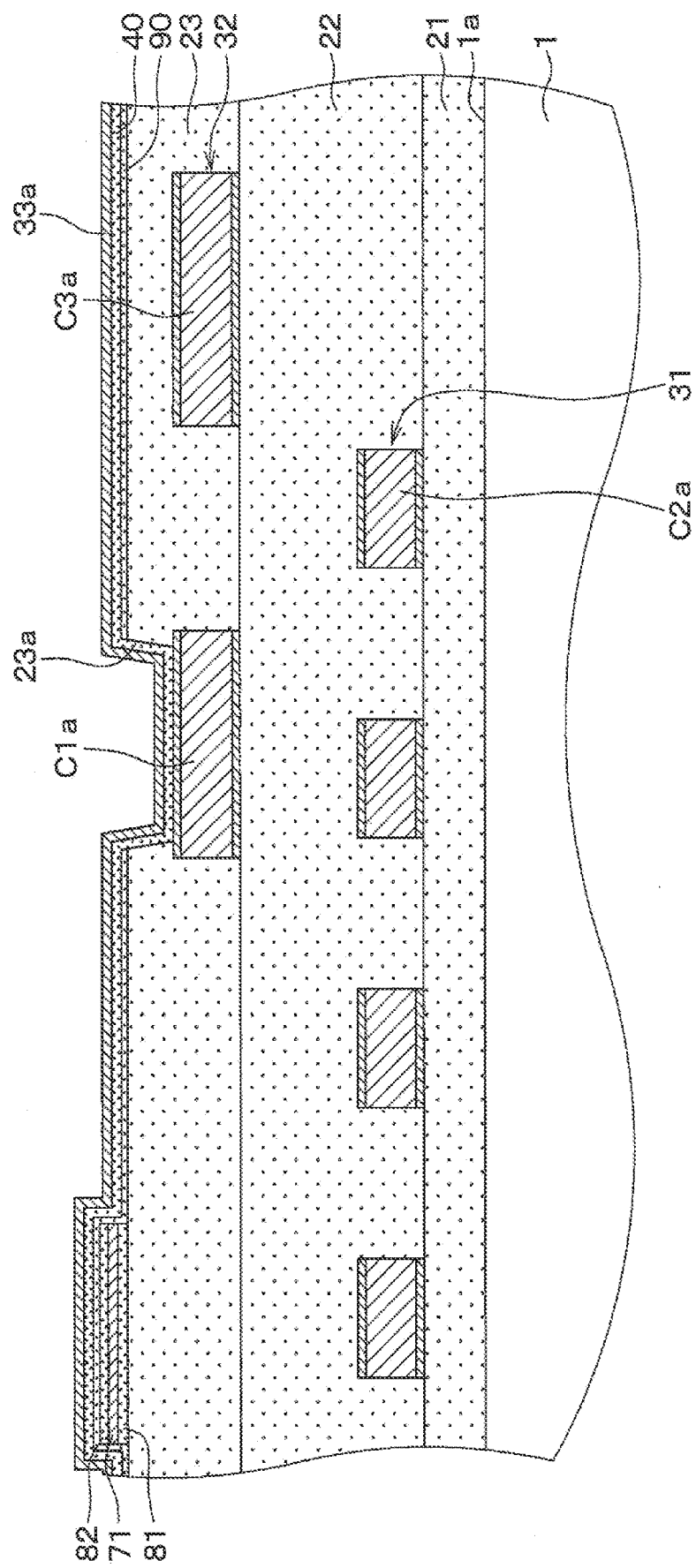
FIG. 6D is a sectional view illustrating the manufacturing process of the semiconductor device following FIG. 6C.

Subsequently, as illustrated in FIG. 6D, the capacitance film 40 and the metal layer 33a are formed in sequence on the protective film 90 through the similar steps to those of FIG. 3D. The metal layer 33a is formed to satisfy $TCR>300$ ppm/° C. by appropriately adjusting nitrogen content during sputter.

Figure 6E:
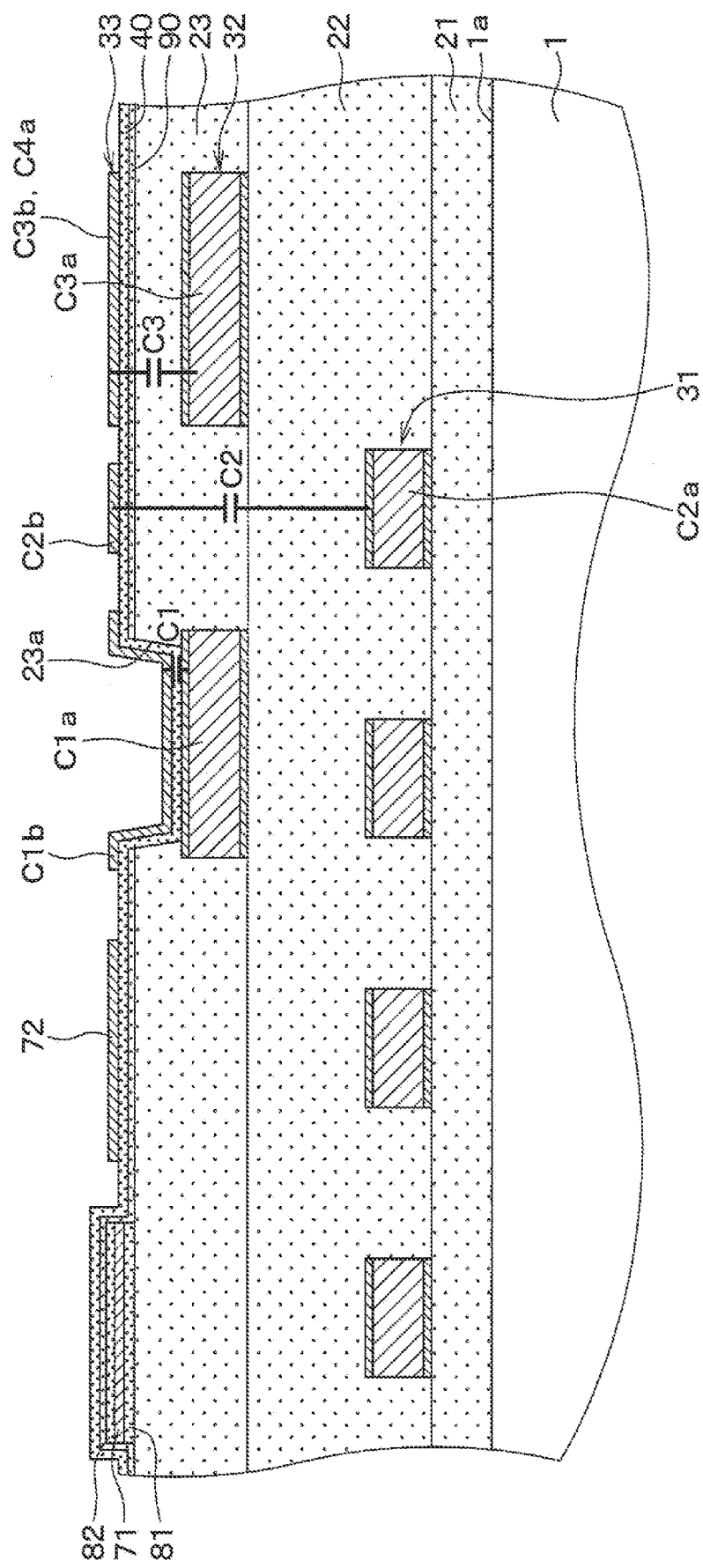
FIG. 6E is a sectional view illustrating the manufacturing process of the semiconductor device following FIG. 6D.

Subsequently, as illustrated in FIG. 6E, a mask (not illustrated) is placed and dry etching is performed to form the third interconnection part 33 including the first to third upper electrodes C1b to C3b and the second resistor 72. In this case, since ends of the first to third upper electrodes C1b to C3b and the second resistor 72 are located on the same plane, it is possible to suppress defocusing in photoresist processing during dry etching.

Figure 6G:
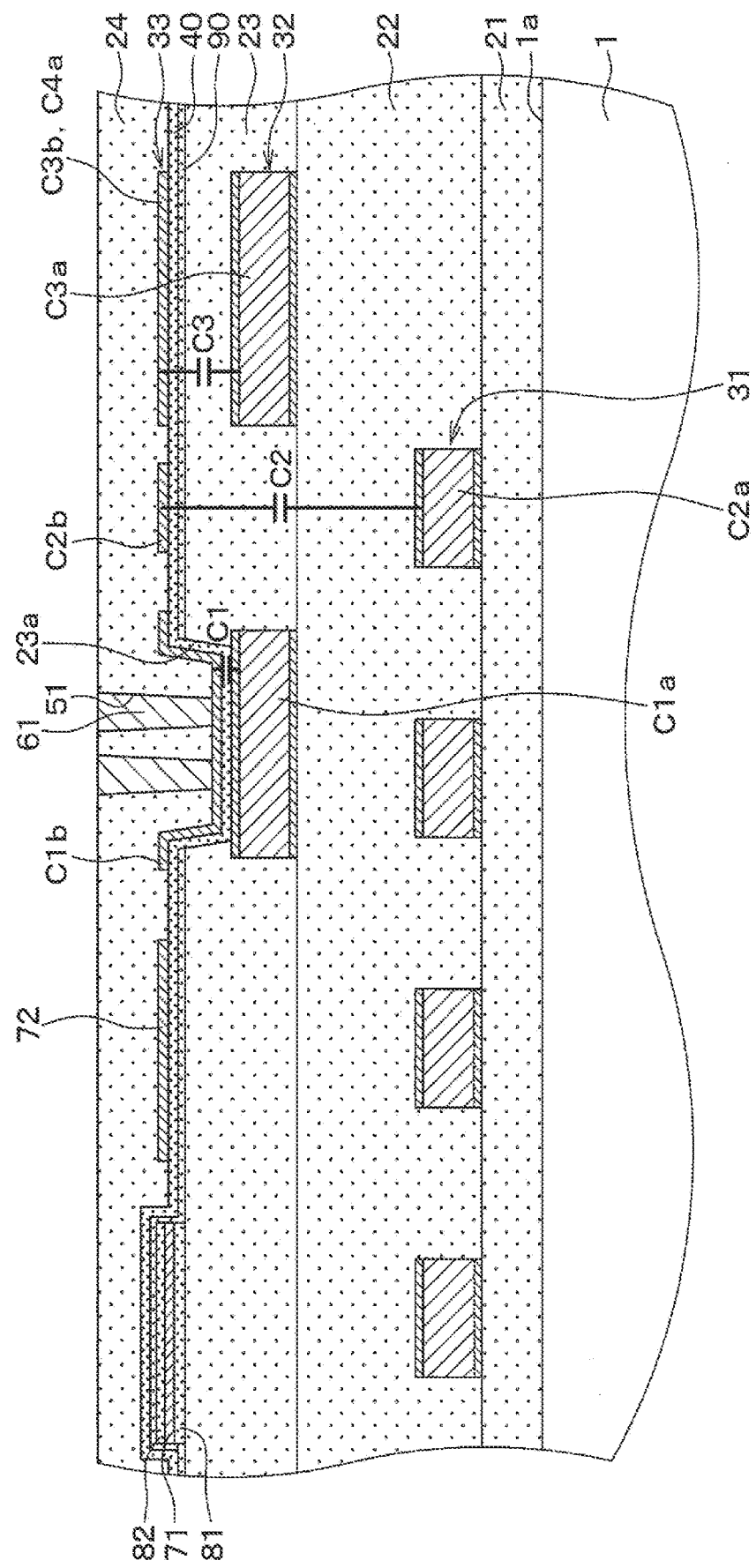
FIG. 6G is a sectional view illustrating the manufacturing process of the semiconductor device following FIG. 6F.

Subsequently, as illustrated in FIG. 6F, the fourth interlayer insulating film 24 is formed through the similar steps to those of FIG. 3F. Subsequently, as illustrated in FIG. 6G, steps similar to those of FIG. 3G are performed to form the first and fourth to sixth via holes 51 and 54 to 56, and then form the first and fourth to sixth connection vias 61 and 64 to 66 in the first and fourth to sixth via holes 51 and 54 to 56, respectively.

Figure 6H:
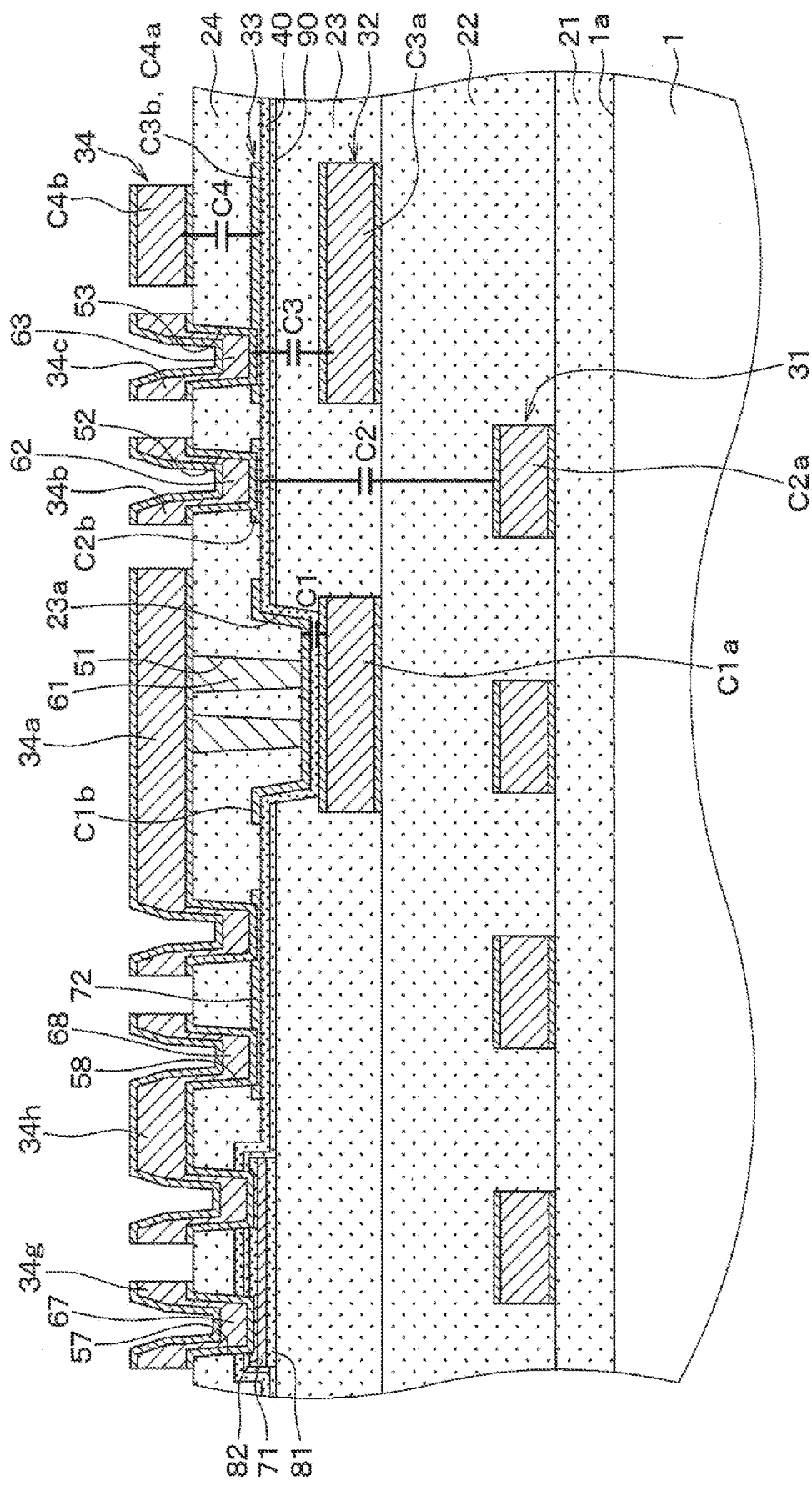
FIG. 6H is a sectional view illustrating the manufacturing process of the semiconductor device following FIG. 6G.

Subsequently, as illustrated in FIG. 6H, steps similar to those of FIG. 3H are performed to form the second and third via holes 52 and 53 and the seventh and eighth via holes 57 and 58. Subsequently, the seventh and eighth upper-layer interconnection parts 34g and 34h are formed together with the first to sixth upper-layer interconnection parts 34a to 34f and the fourth upper electrode C4b on the fourth interlayer insulating film 24. The first upper-layer interconnection part 34a is formed to be connected to the other of the eighth connection vias 68. In this way, the semiconductor device of the second embodiment is manufactured.

As described above, the first embodiment can be applied to the semiconductor device having the first resistor 71 and the second resistor 72.

In the second embodiment, the second resistor 72 is formed by dry etching of the same metal layer 33a as that used for the first to third upper electrodes C1b to C3b. It is therefore possible to simplify a manufacturing process compared with a case where the second resistor 72 is separately formed.

Further, an end of the second resistor 72 is located on the same plane as ends of the first to third upper electrodes C1b to C3b. It is therefore possible to suppress defocusing in photoresist processing during dry etching of the metal layer 33a. The first resistor 71 and the second resistor 72 have temperature coefficients of resistance with opposite positive and negative signs. Hence, when the first resistor 71 and the second resistor 72 are connected in series to form a composite resistor, the composite resistor may have a small temperature coefficient of resistance.

The first resistor 71 has a larger resistance value of the sheet resistance than the second resistor 72, but a smaller absolute value of the temperature coefficient of resistance than the second resistor 72. Hence, when the first resistor 71 and the second resistor 72 are connected in series to adjust the total temperature coefficient of resistance to nearly zero, it is possible to suppress their planar shapes from being extremely different from each other, and in turn suppress the semiconductor device from being enlarged in a planar direction.

Further, the first resistor 71 has a larger resistance value than the second resistor 72. Hence, when the first resistor 71 and the second resistor 72 are connected in series, the first resistor 71 is more responsible for the total resistance value than the second resistor 72. The first resistor 71 is interposed between the lower prevention film 81 and the upper prevention film 82, while no antioxidation film is disposed over the second resistor 72. That is, only the resistor having higher responsibility for the total resistance value is prevented from being oxidized. As a result, when the first resistor 71 and the second resistor 72 are connected in series, it is possible to simplify the manufacturing process by placing no antioxidation film over the second resistor 72 while restricting the total resistance value from being greatly changed.

The second resistor 72 is thicker than the first resistor 71. Hence, when a surface of the second resistor 72 is oxidized, the ratio of the oxidized portion to the whole is small compared with a case where a surface of the first resistor 71 is oxidized, leading to a small variation in resistance value. It is therefore possible to reduce a variation in resistance value even if no antioxidation film is disposed over or under the second resistor 72.

Third Embodiment

A third embodiment is now described. The third embodiment is different from the second embodiment in that respective configurations of the first interconnection part 31, the second interconnection part 32 and the upper-layer interconnection part 34 are different from those of the second embodiment. Other configurations are similar to those of the second embodiment and duplicated description is thus omitted.

Figure 7:
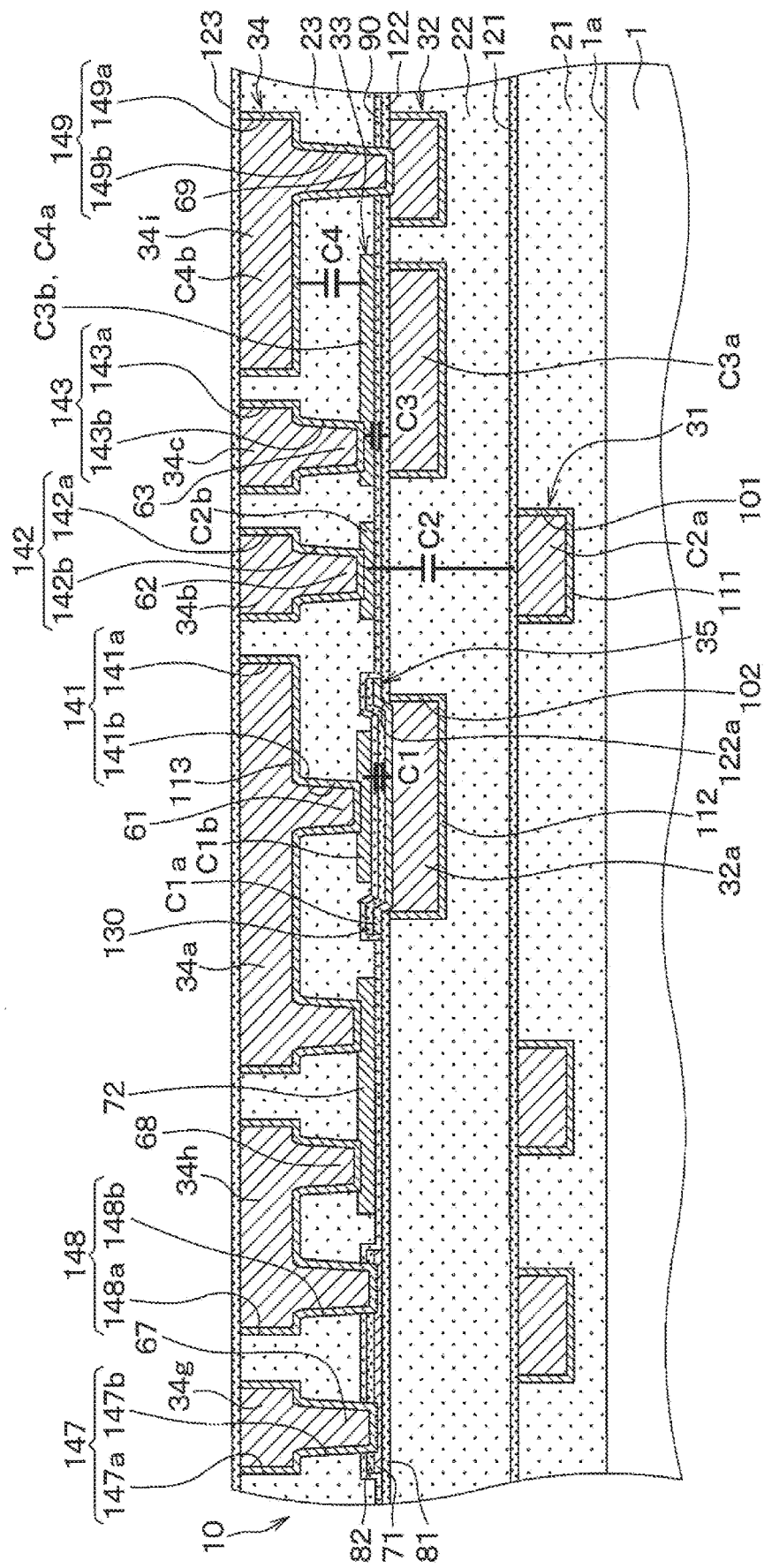
FIG. 7 is a sectional view of a semiconductor device according to a third embodiment.

In the semiconductor device of the third embodiment, as illustrated in FIG. 7, the first interconnection part 31, the second interconnection part 32, and the upper-layer interconnection part 34 are each made of copper (Cu), i.e., formed as a so-called damascene interconnect.

Specifically, the first interlayer insulating film 21 has a first interconnection part trench 101 in its surface on a side opposite to the substrate 1. The first interconnection part 31 is disposed in the first interconnection part trench 101 with a barrier metal 111 in between. The barrier metal 111 is made of tantalum nitride, for example.

A first diffusion prevention film 121 is formed on the first interlayer insulating film 21 to cover the first interconnection part 31 to restrict diffusion of copper forming the first interconnection part 31. The first diffusion prevention film 121 includes a silicon nitride film, a silicon-added silicon carbide film, or the like.

The second interlayer insulating film 22 is disposed on the first diffusion prevention film 121, and has a second interconnection part trench 102 on its surface on a side opposite to the substrate 1. The second interconnection part 32 is disposed in the second interconnection part trench 102 with a barrier metal 112 in between. The barrier metal 112 is made of tantalum nitride, similar to the barrier metal 111.

A second diffusion prevention film 122 having the similar configuration to that of the first diffusion prevention film 121 is formed on the second interlayer insulating film 22 to cover the second interconnection part 32. A contact hole 122a is formed in the second diffusion prevention film 122 to expose a portion of the second interconnection part 32. Hereinafter, the portion of the second interconnection part 32 corresponding to the contact hole 122a will be also referred to as a connection interconnection part 32a.

The first lower electrode C1a as a fifth interconnection part 35 is disposed on the connection interconnection part 32a of the second interconnection part 32. The first lower electrode C1a is made of tantalum nitride, similarly to the first resistor 71. The first lower electrode Ca1 is formed in an area including on top of the connection interconnection part 32a and the periphery of the contact hole 122a. That is, the first lower electrode C1a has a difference in level at its end. In the third embodiment, the first resistor 71 is formed by the same steps as those for the first lower electrode C1a as described later. The first resistor 71 is therefore also included in the fifth interconnection part 35.

A lower-layer capacitance film 130 is formed on the first lower electrode C1a. The lower-layer capacitance film 130 also includes a silicon nitride film, a nitrogen-added silicon carbide film, or the like, similar to the upper prevention film 82.

The first resistor 71 and the upper prevention film 82 are formed on the second diffusion prevention film 122. The protective film 90 is formed over the second diffusion prevention film 122 to cover the first resistor 71, the upper prevention film 82, the first lower electrode C1a, and the lower-layer capacitance film 130. The second diffusion prevention film 122 is made of a silicon nitride film, a nitrogen-added silicon carbide film, or the like, and also serves as an antioxidation film. In the third embodiment, therefore, a portion of the second diffusion prevention film 122 located under the first resistor 71 also serves as the lower prevention film 81.

The third interconnection part 33 including the first to third upper electrodes C1b to C3b and the second resistor 72 is formed on the protective film 90. Consequently, the first to third capacitors C1 to C3 are formed.

The first capacitor C1 of the third embodiment is made of the first lower electrode C1a, the first upper electrode C1b, and the lower-layer capacitance film 130 and the protective film 90 located between the first lower electrode C1a and the first upper electrode C1b. In the first capacitor C1, the lower-layer capacitance film 130 and the protective film 90 located between the first lower electrode C1a and the first upper electrode C1b collectively serve as the capacitance layer. In the second capacitor C2, the first diffusion prevention film 121, the second interlayer insulating film 22, the second diffusion prevention film 122, and the protective film 90 located between the second lower electrode C2a and the second upper electrode C2b collectively serve as the capacitance layer. In the third capacitor C3, the second diffusion prevention film 122 and the protective film 90 located between the third lower electrode C3a and the third upper electrode C3b collectively serve as the capacitance layer.

In the third embodiment, the first upper electrode C1b is opposed to only a portion of the first lower electrode C1a disposed in the contact hole 122a. That is, the first upper electrode C1b is opposed to only a flat portion of the first lower electrode C1a to avoid formation of a difference in level.

The second upper electrode C2b, the third upper electrode C3b, and the second resistor 72 are disposed on the second diffusion prevention film 122 with the protective film 90 in between. On the other hand, the first upper electrode C1b is disposed via the first lower electrode C1a, the lower-layer capacitance film 130, and the protective film 90. The first lower electrode C1a and the lower-layer capacitance film 130 are therefore each adjusted in thickness such that an end of the first upper electrode C1b is located on the same plane as the second upper electrode C2b, the third upper electrode C3b, and the second resistor 72.

The third interlayer insulating film 23 is disposed on the second diffusion prevention film 122, and has, in its surface, first to third, seventh, and eighth upper-layer interconnection part trenches 141 to 143, 147, and 148 corresponding to the first to third, seventh, and eighth via holes 51 to 53, 57, and 58, respectively. A ninth upper-layer interconnection part trench 149 is also formed in the third interlayer insulating film 23 to expose a portion of the second interconnection part 32.

In the third embodiment, surface side trenches 141a to 143a and 147a to 149a are formed adjacent to the surface of the third interlayer insulating film 23. Contact holes 141b to 143b and 147b to 149b are formed to expose the second interconnection part 32, the third interconnection part 33, and the first resistor 71 from the bottoms of the surface side trenches 141a to 143a and 147a to 149a. The first to third and seventh to ninth upper-layer interconnection part trenches 141 to 143 and 147 to 149 are formed of the surface side trenches 141a to 143a and 147a to 149a in communication with the contact holes 141b to 143b and 147b to 149b, respectively.

The upper-layer interconnection part 34 is disposed in each of the first to third and seventh to ninth upper-layer interconnection part trenches 141 to 143 and 147 to 149 with a barrier metal 113 in between. Specifically, first to third and seventh to ninth upper-layer interconnection parts 34a to 34c and 34g to 34i are disposed in the first to third and seventh to ninth upper-layer interconnection part trenches 141 to 143 and 147 to 149, respectively. The portions of the first to third and seventh to ninth upper-layer interconnection parts 34a to 34c and 34g to 34i located in the contact holes 141b to 143b and 147b to 149b correspond to the first to third and seventh to ninth connection vias 61 to 63 and 67 to 69, respectively.

The ninth upper-layer interconnection part 34i configures the fourth upper electrode C4b and is connected to the portion of the second interconnection part 32. Although not illustrated, in a cross section different from that of FIG. 7, there is provided an upper-layer interconnection part trench (not illustrated) that corresponds to the fourth via hole 54 and exposes the connection interconnection part 32a to be connected to the first lower electrode C1a. Likewise, in a cross section different from that of FIG. 7, there is provided fifth and sixth interconnection part trenches that correspond to the fifth and sixth via holes 55 and 56 and expose the first and second interconnection parts 31 and 32 forming the second and third lower electrodes C2a and C3a, respectively. The fourth to sixth upper-layer interconnection parts 34d to 34f of the upper-layer interconnection part 34 are disposed in the fourth to sixth upper-layer interconnection part trenches, respectively, with the barrier metal 113 in between.

A third diffusion prevention film 123 having the same configuration as the first diffusion prevention film 121 is formed on the third interlayer insulating film 23 to cover the upper-layer interconnection part 34.

The above is the configuration of the semiconductor device of the third embodiment. A method for manufacturing the semiconductor device of the third embodiment is now described.

Figure 8A:
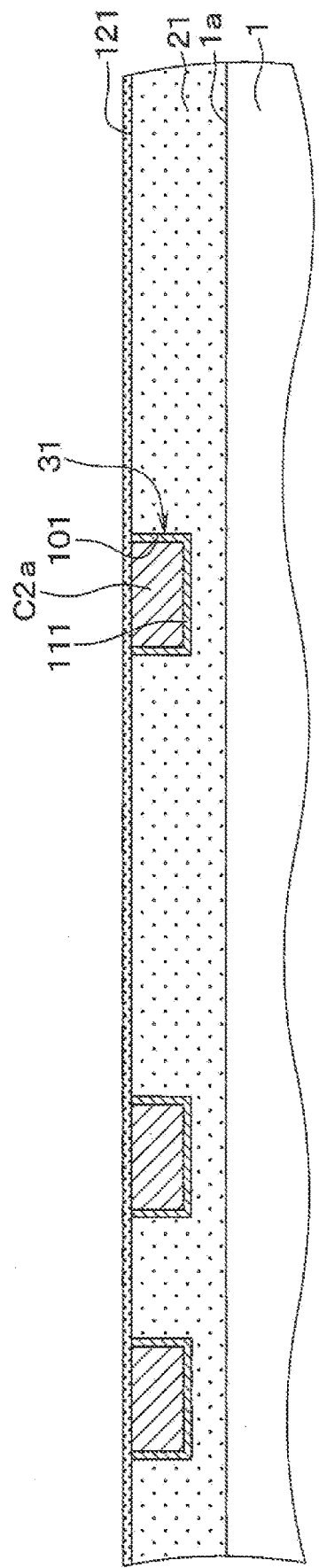
FIG. 8A is a sectional view illustrating a manufacturing process of the semiconductor device shown in FIG. 7.

First, as illustrated in FIG. 8A, the first interlayer insulating film 21 is formed on the one surface 1a of the substrate 1. A mask (not illustrated) is then placed and dry etching is performed to form the first interconnection part trench 101 in the first interlayer insulating film 21.

Subsequently, the first interconnection part 31 is provided in the first interconnection part trench 101 with the barrier metal 111 in between. In the third embodiment, the barrier metal 111 is first formed by a sputter process or the like in the first interconnection part trench 101, and then a copper seed layer is formed on the barrier metal 111. The first interconnection part 31 is then formed by a plating process or the like to fill the first interconnection part trench 101.

During formation of the first interconnection part 31, copper is also deposited on the first interlayer insulating film 21 while the copper is to form the first interconnection part 31. Hence, the copper deposited on the first interlayer insulating film 21 is removed by a CMP process or the like.

Subsequently, the first diffusion prevention film 121 is formed on the first interlayer insulating film 21 by a CVD process or the like.

Figure 8B:
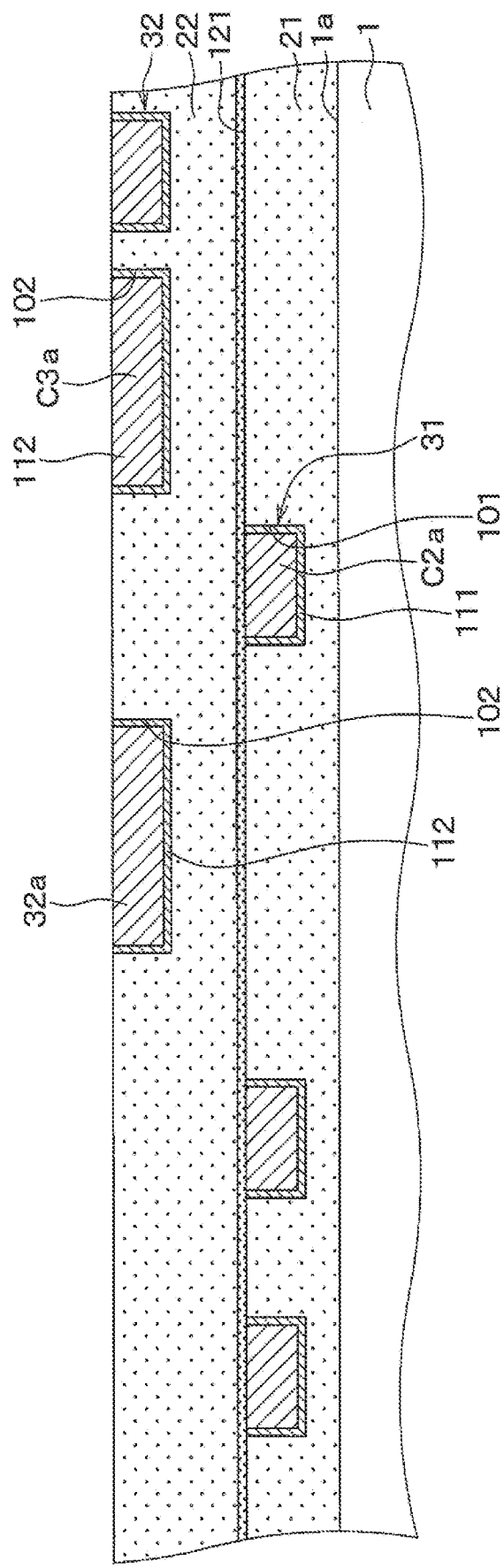
FIG. 8B is a sectional view illustrating the manufacturing process of the semiconductor device following FIG. 8A.

Subsequently, as illustrated in FIG. 8B, the second interlayer insulating film 22 is formed on the first interlayer insulating film 21. The similar steps to those of FIG. 8A are then performed to form the second interconnection part trench 102 in the second interlayer insulating film 22 and form the second interconnection part 32 in the second interconnection part trench 102. In the third embodiment, the first interconnection part 31 is covered with the first diffusion prevention film 121. This suppresses a change in properties of the first interconnection part 31 due to, for example, formation of a copper compound through a reaction during formation of the second interlayer insulating film 22. The later-described second diffusion prevention film 122 also exhibits a similar effect.

Figure 8C:
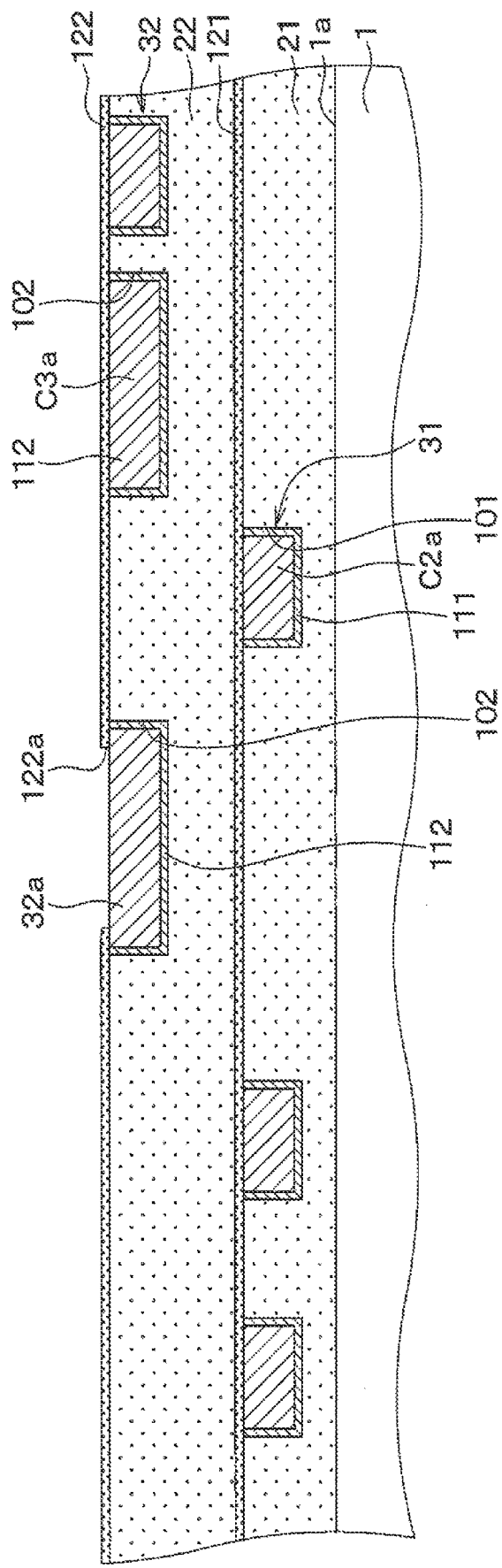
FIG. 8C is a sectional view illustrating the manufacturing process of the semiconductor device following FIG. 8B.

Subsequently, as illustrated in FIG. 8C, the second diffusion prevention film 122 is formed on the second interlayer insulating film 22 by a CVD process or the like. A mask (not illustrated) is then placed on the second diffusion prevention film 122 and dry etching is performed to form the contact hole 122a to expose the connection interconnection part 32a of the second interconnection part 32.

Figure 8D:
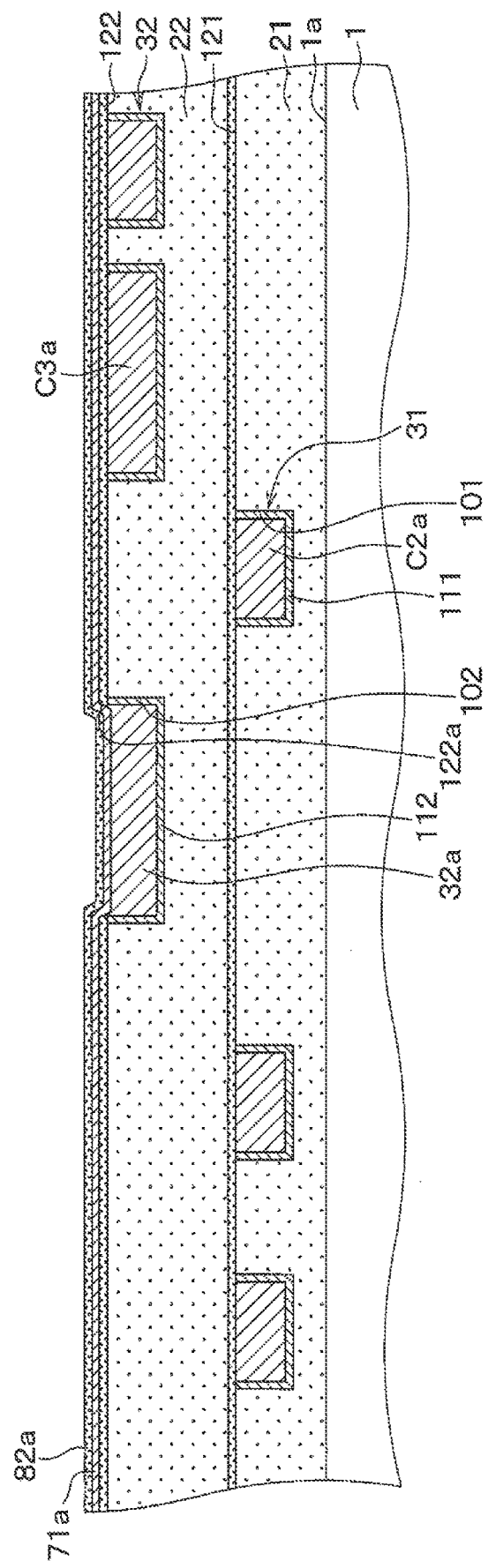
FIG. 8D is a sectional view illustrating the manufacturing process of the semiconductor device following FIG. 8C.

Subsequently, as illustrated in FIG. 8D, a metal layer 71a made of tantalum nitride is formed by a sputter process or the like on the second diffusion prevention film 122 to fill the contact hole 122a, and then a prevention layer 82a including a nitride film is formed by a CVD process or the like. The metal layer 71a and the prevention layer 82a are each adjusted in thickness such that an end of the first upper electrode C1b is located on the same plane as the second upper electrode C2b, the third upper electrode C3b, and the second resistor 72.

Figure 8E:
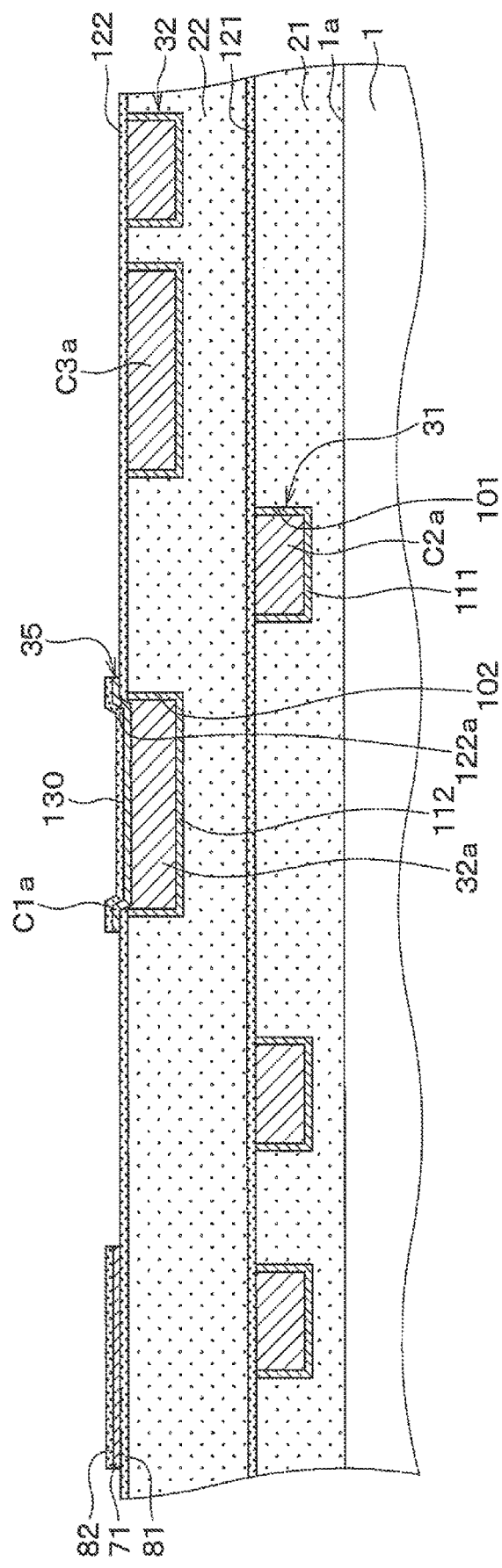
FIG. 8E is a sectional view illustrating the manufacturing process of the semiconductor device following FIG. 8D.

Subsequently, as illustrated in FIG. 8E, a mask (not illustrated) is placed on the prevention layer 82a and dry etching is performed. As a result, the upper prevention film 82 is formed along with formation of the fifth interconnection part 35 including the first resistor 71 and the first lower electrode C1a.

Figure 8F:
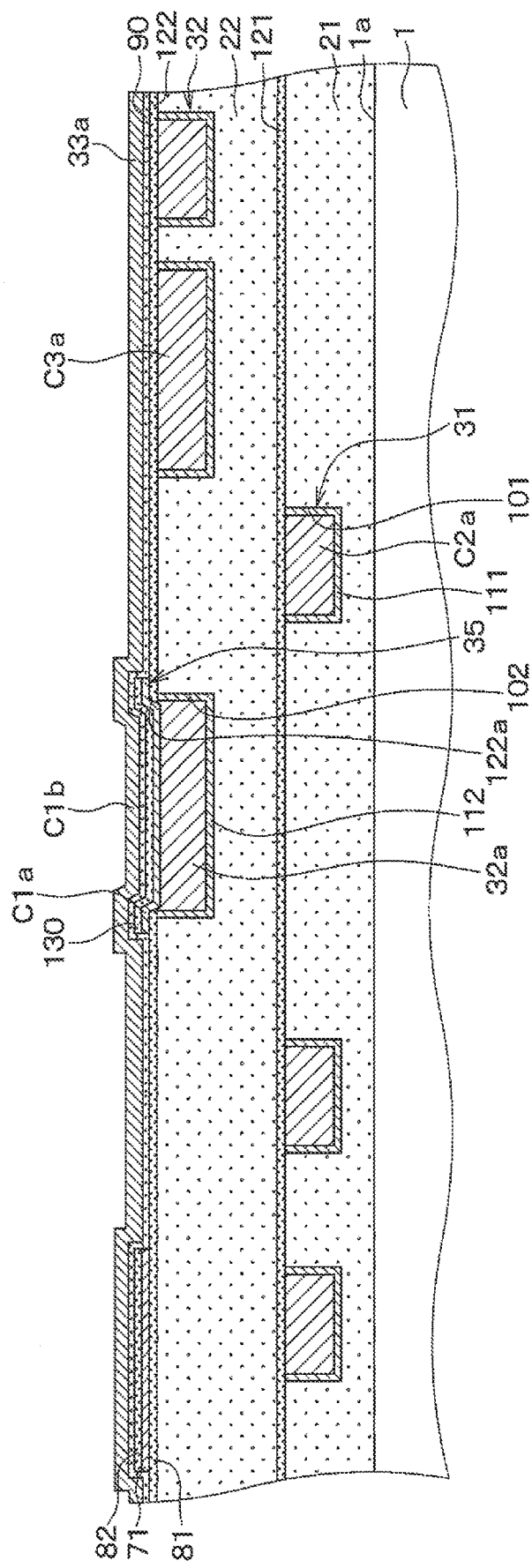
FIG. 8F is a sectional view illustrating the manufacturing process of the semiconductor device following FIG. 8E.

Subsequently, as illustrated in FIG. 8F, the similar step to those of FIG. 6B are performed to form the protective film 90 to cover the first resistor 71, the upper prevention film 82, the first lower electrode C1a, and the lower-layer capacitance film 130. Subsequently, the metal layer 33a is formed on the protective film 90 through the similar steps to those of FIG. 3D.

Figure 8G:
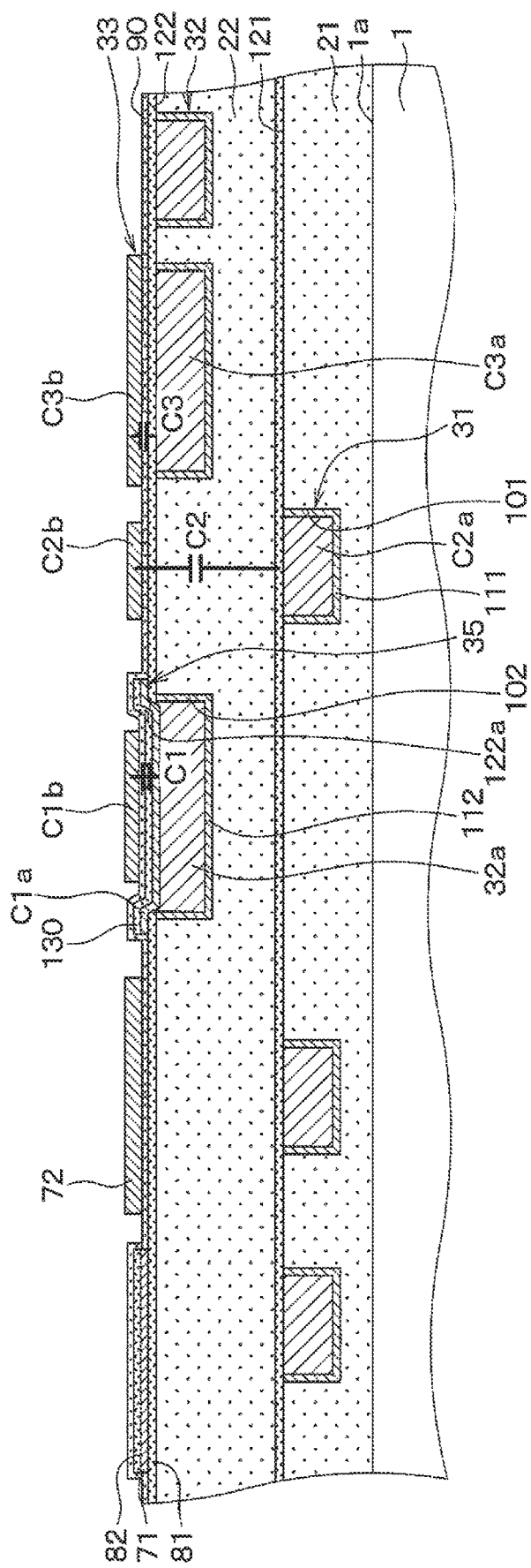
FIG. 8G is a sectional view illustrating the manufacturing process of the semiconductor device following FIG. 8F.

Subsequently, as illustrated in FIG. 8G, the third interconnection part 33 including the first upper electrodes C1b to C3b and the second resistor 72 is formed through the similar steps to those of FIG. 6E. In this case, ends of the first to third upper electrodes C1b to C3b and the second resistor 72 are located on the same plane. It is therefore possible to suppress defocusing in photoresist processing during dry etching.

Figure 8H:
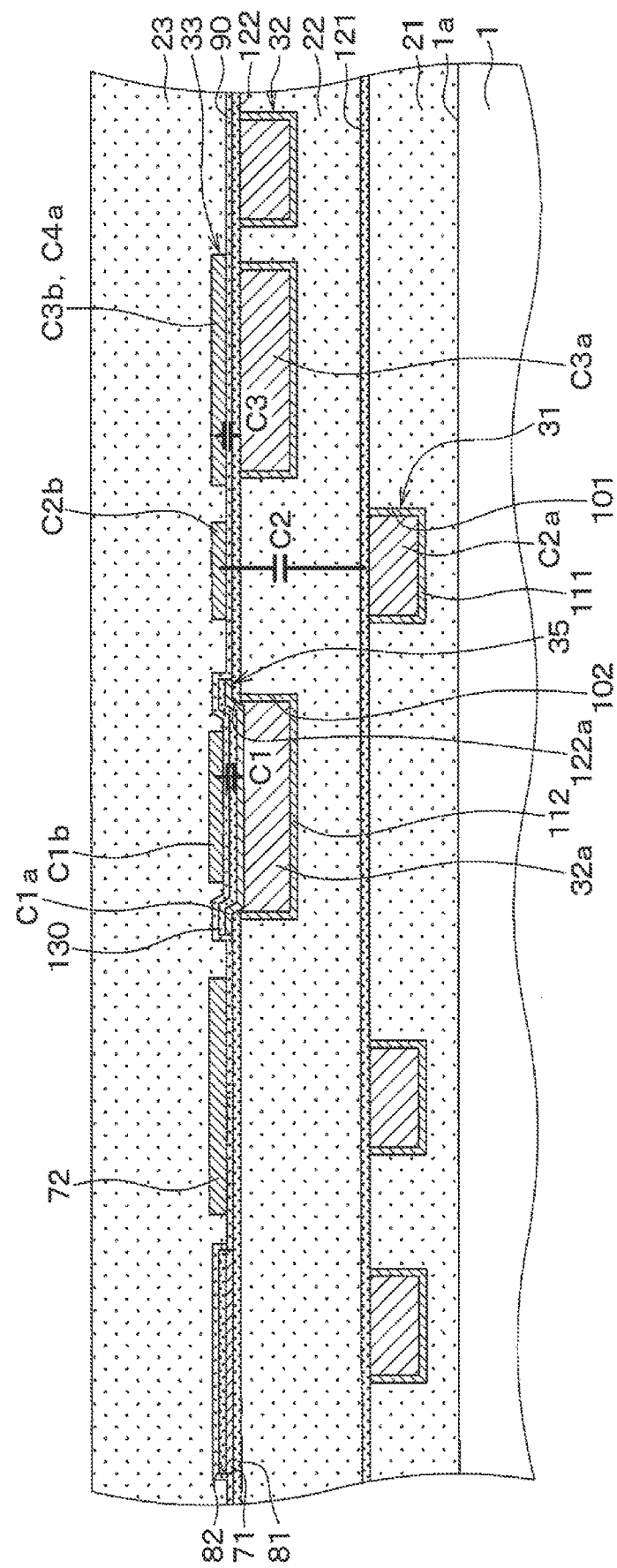
FIG. 8H is a sectional view illustrating the manufacturing process of the semiconductor device following FIG. 8G.
Figure 8I:
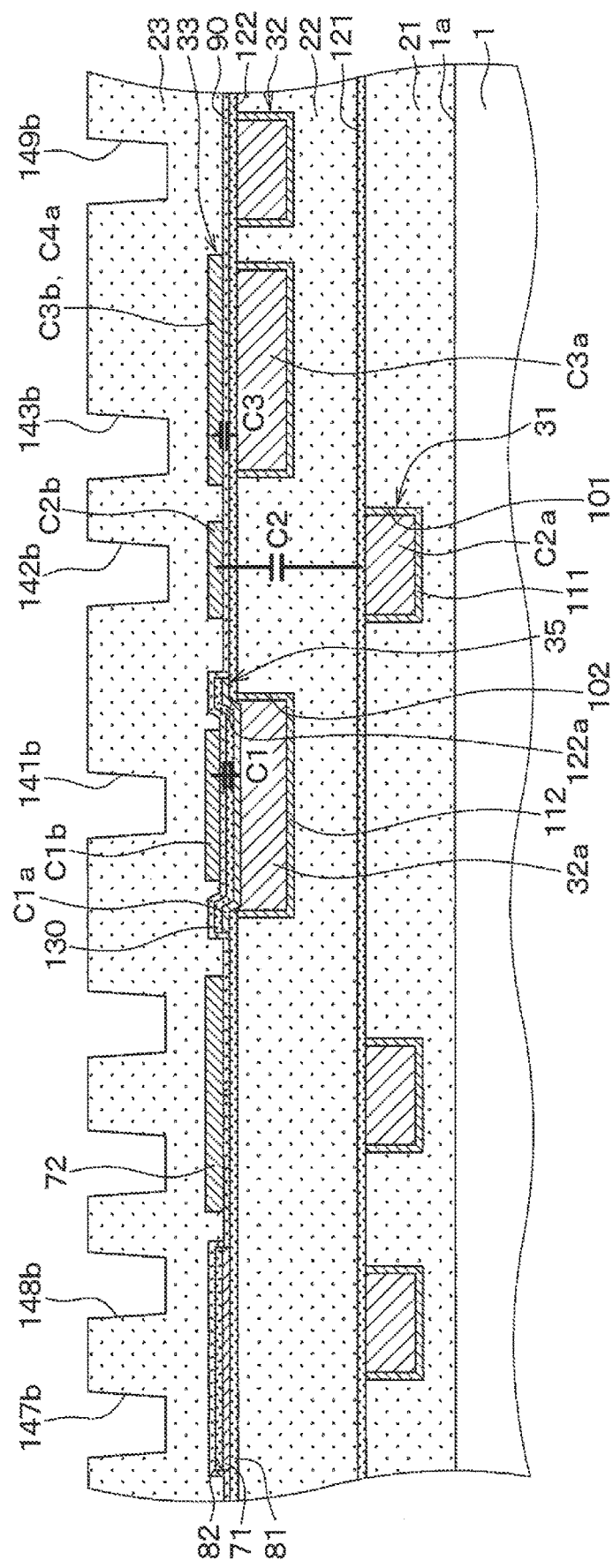
FIG. 8I is a sectional view illustrating the manufacturing process of the semiconductor device following FIG. 8H.

Subsequently, as illustrated in FIG. 8H, the third interlayer insulating film 23 is formed through the similar steps to those of FIG. 3F. Subsequently, as illustrated in FIG. 8I, a mask (not illustrated) is placed and dry etching is performed. In this step of the third embodiment, portions to be the contact holes 141b to 143b and 147b to 149b are first dug down.

Figure 8J:
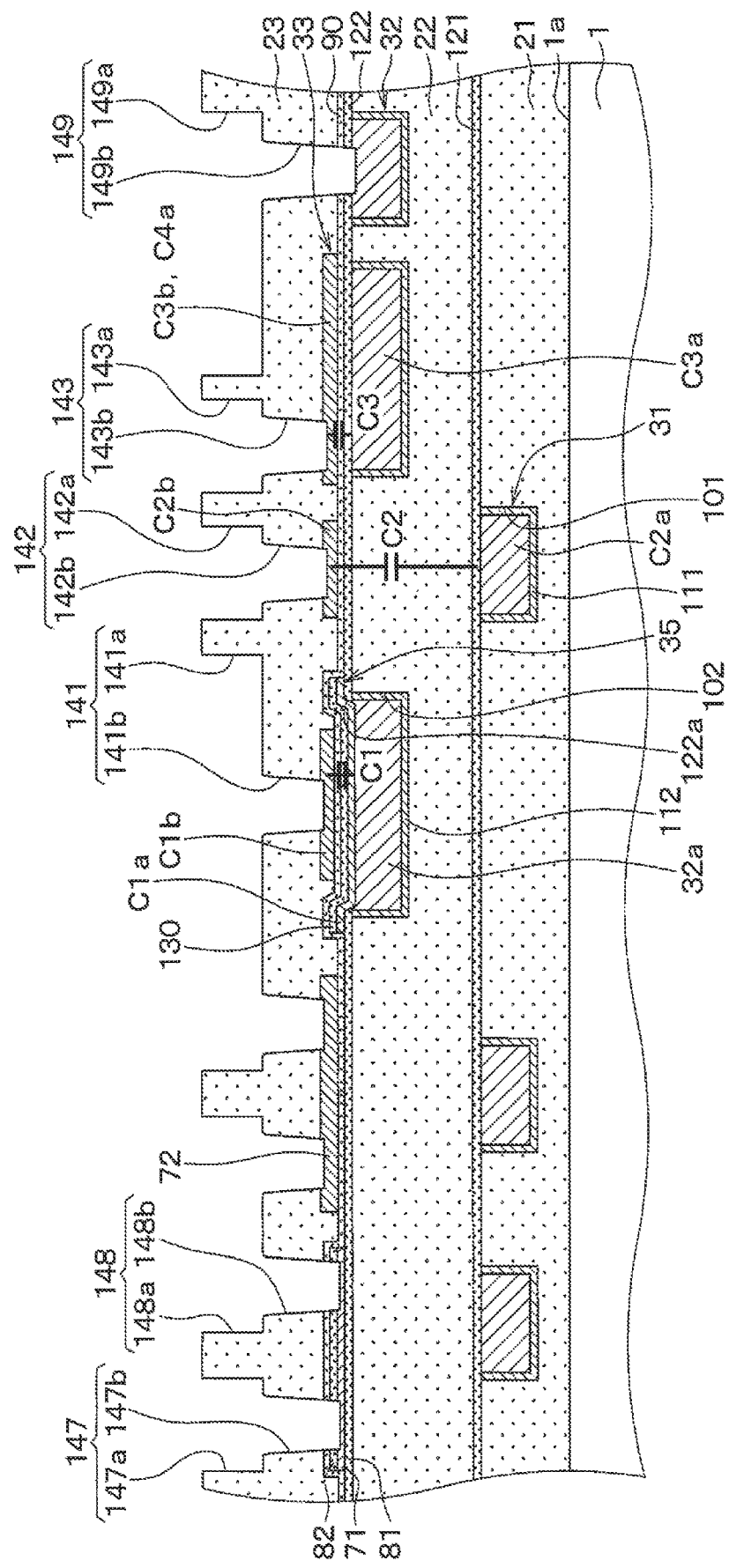
FIG. 8J is a sectional view illustrating the manufacturing process of the semiconductor device following FIG. 8I.

Subsequently, as illustrated in FIG. 8J, a mask (not illustrated) is placed again and dry etching is performed. As a result, the portions to be the contact holes 141b to 143b and 147b to 149b are further dug down while the surface side trenches 141a to 143a and 147a to 149a are gradually formed, resulting in formation of the first to third and seventh to ninth upper-layer interconnection part trenches 141 to 143 and 147 to 149. In the steps of FIGS. 8I and 8J, the fourth upper-layer interconnection part trench is formed in another cross section to expose the connection interconnection part 32a. In addition, the fifth upper-layer interconnection part trench and the sixth upper-layer interconnection part trench are formed to expose the first interconnection part forming the second lower electrode C2a and the second interconnection part 32 forming the third lower electrode C3a, respectively.

Figure 8K:
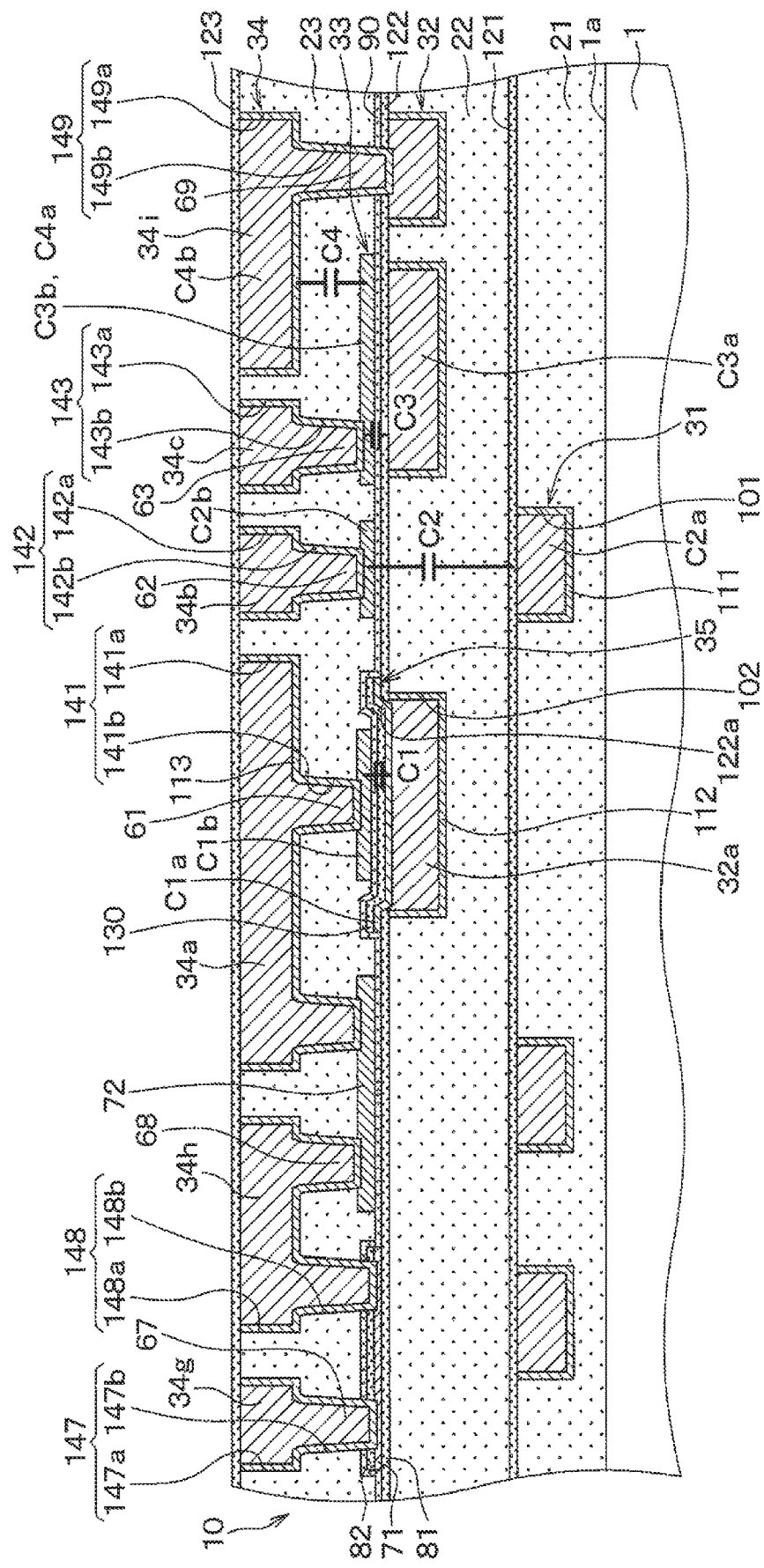
FIG. 8K is a sectional view illustrating the manufacturing process of the semiconductor device following FIG. 8J.

Subsequently, as illustrated in FIG. 8K, the upper-layer interconnection part 34 and the third diffusion prevention film 123 are formed through the similar steps to those of FIG. 8A. Thus, the semiconductor device described above is manufactured.

As described above, in the semiconductor device including the damascene interconnect, the first upper electrode C1b, the second upper electrode C2b, and the third upper electrode C3b (or fourth lower electrode C4a) are also formed by dry etching of the common metal layer 33a. The similar effects to those of the first embodiment are therefore provided.

Other Embodiments

While the present disclosure has been described with reference to embodiments thereof, it is to be understood that the disclosure is not limited to the embodiments and constructions. The present disclosure is intended to cover various modification and equivalent arrangements. In addition, while the various combinations and configurations, other combinations and configurations, including more, less or only a single element, are also within the spirit and scope of the present disclosure.

For example, each of the above embodiments has been described with an example where the first to fourth capacitors C1 to C4 have different capacitances. However, some of the first to fourth capacitors C1 to C4 may have the same capacitance. In each of the embodiments, the number of capacitors to be provided may be appropriately varied. For example, in each of the embodiments, only the first and second capacitors C1 and C2 may be provided.

In the first embodiment described above, the third interconnection part 33 may be configured as a stack of titanium nitride, aluminum, and titanium nitride, similar to the first interconnection part 31 or the like. In each of the embodiments described above, the first interconnection part 31 may be made of a single-layer film of such as aluminum, titanium nitride, impurity-doped polysilicon, or metal silicide. Similarly, the material of the second interconnection part 32 may also be appropriately changed.

In the first and second embodiments described above, the hole 23a formed in the third interlayer insulating film 23 may not expose the first lower electrode C1a. That is, the first capacitor C1 may have a capacitance layer including the capacitance film 40 and the third interlayer insulating film 23 between the first lower electrode C1a and the first upper electrode C1b.

In the first and second embodiments described above, the first via hole 51 may be formed to expose a portion of the first upper electrode C1b located above the third interlayer insulating film 23. That is, the first via hole 51 may be formed to expose a portion of the first upper electrode C1b extended to the periphery of the hole 23a. In such a case, since the first via hole 51 has a depth equal to the depth of each of the second and third via holes 52 and 53, the first connection via 61 may be formed by filling the first via hole 51 with the first upper-layer interconnection part 34*a*.

In the second embodiment described above, the antioxidation film may also be disposed over the second resistor 72. The second resistor 72 may have a larger sheet resistance or a smaller absolute value of the temperature coefficient of resistance than the first resistor 71. Further, the second resistor 72 may have a smaller thickness and a larger resistance value than the first resistor 71.

Figure 9:
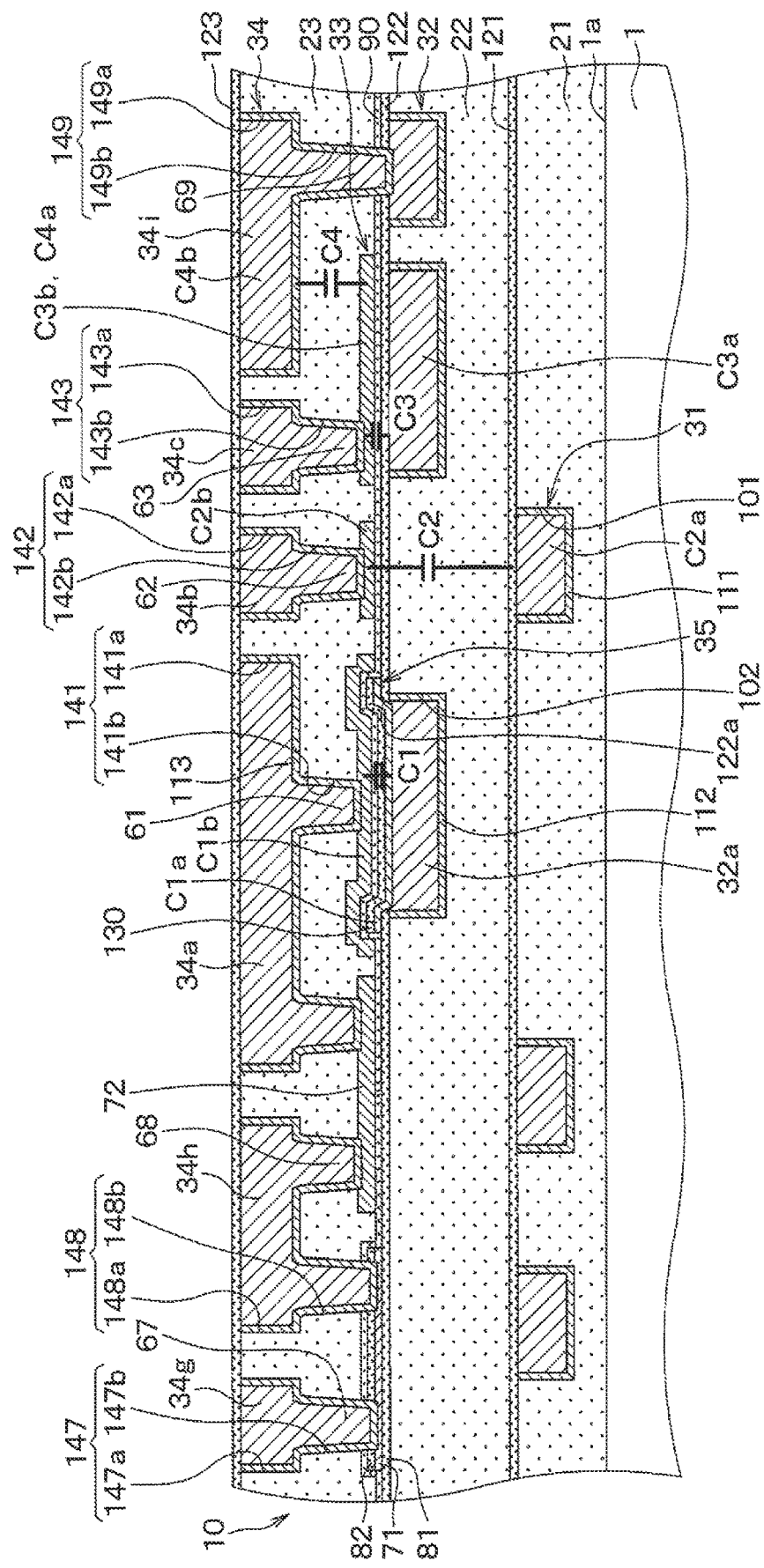
FIG. 9 is a sectional view of a semiconductor device of another embodiment.

In the third embodiment described above, a shape of the first upper electrode C1*b* may be appropriately varied as long as the end of the first upper electrode C1*b* is located on the same plane as the second upper electrode C2*b* or the like. For example, as illustrated in FIG. 9, the end of the first upper electrode C1*b* may be extended to over the periphery of the contact hole 122*a*. That is, the first upper electrode C1*b* may be configured such that its end is disposed over the second interlayer insulating film 22 with the second diffusion prevention film 122 and the protective film 90 in between, similar to the second upper electrode C2*b*. This makes it possible to appropriately change thickness of each of the first lower electrode C1*a* and the lower-layer capacitance film 130, leading to an increase in the degree of freedom of design.

Furthermore, the embodiments described above may be combined. For example, the semiconductor device of the third embodiment may not have the first and second resistors 71 and 72, as in the first embodiment.

What is claimed is:

1. A semiconductor device comprising:
   a substrate having one surface; and
   an interconnection layer disposed on the one surface of the substrate, the interconnection layer including a plurality of capacitors each having a metal-insulator-metal structure, wherein
   the interconnection layer has a plurality of insulating films and a plurality of interconnection parts alternately stacked in a stacked direction,
   each of the capacitors includes a first electrode and a second electrode provided by any two of the plurality of interconnection parts opposed to each other in the stacked direction, in which the first electrode is one of the two interconnection parts located adjacent to the substrate and the second electrode is the other located opposite to the substrate with respect to the first electrode,
   among the plurality of capacitors, one of the first electrode and the second electrode of each capacitor is provided by a same one of the interconnection parts as a subject electrode, and a distance between the first electrode and the second electrode is different among the plurality of capacitors to have different capacitances among the plurality of capacitors, and
   the subject electrodes provided by the same one of the interconnection parts are covered with at least one of the insulating films, and have ends located on a same plane,
   wherein
   the plurality of insulating films include first to fourth insulating films, and the plurality of interconnection parts include first to fourth interconnection parts,
   the first insulating film is disposed on the one surface of the substrate,
   the first interconnection part is disposed on the first insulating film,
   the second insulating film is disposed on the first insulating film to cover the first interconnection part,
   the second interconnection part is disposed on the second insulating film,
   the third insulating film is disposed on the second insulating film to cover the second interconnection part,
   the third interconnection part is disposed on the third insulating film, and
   the fourth insulating film is disposed on the third insulating film to cover the third interconnection part,
   the plurality of capacitors include a first capacitor including portions of the second interconnection part and the third interconnection part opposed to each other, a second capacitor including portions of the first interconnection part and the third interconnection part opposed to each other, a third capacitor including portions of the second interconnection part and the third interconnection part opposed to each other, and a fourth capacitor,
   the third insulating film is formed with a hole in a region corresponding to the portion of the second interconnection part, the portion forming the first electrode of the first capacitor,
   the portion of the third interconnection part forming the second electrode as the subject electrode of the first capacitor is disposed on the first electrode of the first capacitor through a capacitance film in the hole, and is extended outside the hole such that an end thereof is disposed on a periphery of the hole and on the same plane as the end of the second electrode as the subject electrode of each of the second and third capacitors in the third interconnection part,
   the fourth interconnection part is disposed on the fourth insulating film, as an upper-layer interconnection part, and includes an upper electrode portion, a first portion, a second portion, a third portion, a fourth portion, a fifth portion, and a sixth portion,
     the upper electrode portion being the second electrode of the fourth capacitor that faces the portion of the third interconnection part forming the second electrode of the third capacitor across the fourth insulating, such that the second electrode of the third capacitor and the first electrode of the fourth capacitor are provided by the same portion of the third interconnection part as the subject electrodes,
     the first portion facing the second electrode of the first capacitor, which is provided by the third interconnection part and received in the hole, across the fourth insulating film,
   in the hole, the fourth insulating film is disposed on the second electrode of the first capacitor to fill the hole, and a distance between the second electrode of the first capacitor disposed in the hole and the first portion of the fourth interconnection part corresponding to a position of the hole is larger than a distance between the first electrode of the fourth capacitor and the second electrode of the fourth capacitor provided by the upper electrode portion of the fourth interconnection part,
   a first connection via is disposed to pass through the fourth insulating film between the second electrode of the first capacitor and the first portion of the fourth interconnection part,
   the upper electrode portion of the fourth interconnection part has a flat first upper surface and a flat first lower surface,
   the upper electrode portion of the fourth interconnection part has a flat second upper surface and a flat second lower surface, the second portion of the fourth interconnection part is recessed to reach the subject electrode of the second capacitor through the fourth insulating film and forms a second connection via, the third portion of the fourth interconnection part is recessed to reach the subject electrode of the third capacitor through the fourth insulating film and forms a third connection via, the portion of the second interconnection part forming the first electrode of the first capacitor is extended to a position outside a first capacitor formation region overlapping the subject electrode of the first capacitor, and is connected to the fourth portion of the fourth interconnection part through a fourth connection via passing through the third and fourth insulating films outside the first capacitor formation region, the portion of the first interconnection part forming the first electrode of the second capacitor is extended to a position outside a second capacitor formation region overlapping the subject electrode of the second capacitor, and is connected to the fifth portion of the fourth interconnection part through a fifth connection via passing through the second to fourth insulating films outside the second capacitor formation region, and the portion of the second interconnection part forming the first electrode of the third capacitor is extended to a position outside a third capacitor formation region overlapping the subject electrode of the third and fourth capacitors, and is connected to the sixth portion of the fourth interconnection part through a sixth connection via passing through the third and fourth insulating films outside the third capacitor formation region.

2. The semiconductor device according to claim 1, wherein
the interconnection layer includes a first resistor and a second resistor connected in series to the first resistor,
one of the first resistor and the second resistor has a temperature coefficient of resistance with a positive value while the other of the first and second resistors has a temperature coefficient of resistance with a negative value, and
the second resistor has an end located on the same plane as the ends of the subject electrodes provided by the same interconnection part, and is made of a same material as the subject electrodes.

3. The semiconductor device according to claim 1, wherein
the portion of the third interconnection part forming the second electrode of the first capacitor is disposed on the first electrode of the first capacitor only through the capacitance film in the hole, and in each of the second capacitor and the third capacitor, the second electrode faces the first electrode through the capacitance film and at least one insulating film.

4. The semiconductor device according to claim 3, wherein
the interconnection layer further includes a protection film on the third insulating film except inside of the hole
the capacitance film is disposed on the protection film, and
in the hole, the second electrode of the first capacitor is disposed on the first electrode only through the capacitance film.

5. The semiconductor device according to claim 1, wherein
the subject electrodes of the second to fourth capacitors are planar and disposed on the same plane, and
the end of the subject electrode of the first capacitor is disposed on the same plane on which the subject electrodes of the second to fourth capacitors are disposed, and a part of the subject electrode other than the end is disposed in the hole recessed from the plane on which the subject electrodes of the second to fourth capacitors are disposed.

6. The semiconductor device according to claim 2, wherein
the fourth interconnection layer includes portions facing the first resistor and the second resistor.

7. The semiconductor device according to claim 3, wherein
the distance between the first electrode and the second electrode of the fourth capacitor is different from those of the first capacitor and the second capacitor, and a facing area between the first electrode and the second electrode of the fourth capacitor is different from a facing area of the first electrode and the second electrode of the third capacitor.

8. The semiconductor device according to claim 1, wherein
the upper electrode portion of the fourth interconnection part has a uniform thickness, and
the first portion of the fourth interconnection part has the uniform thickness.

9. The semiconductor device according to claim 1, wherein
the fourth portion, the fifth portion and the sixth portion of the fourth interconnection part are extended opposite to the first capacitor formation region, the second capacitor formation region, and the third capacitor formation region with respect to the fourth connection via, the fifth connection via and the sixth connection via, respectively.

* * * * *